US008274827B2

(12) United States Patent
Shirota et al.

(10) Patent No.: US 8,274,827 B2
(45) Date of Patent: Sep. 25, 2012

(54) MEMORY DEVICE AND OPERATING METHOD THEREOF

(75) Inventors: Riichiro Shirota, Kanagawa-prefecture (JP); Te-Chang Tseng, Hsinchu County (TW)

(73) Assignee: RobustFlash Technologies Ltd., Hsinchu County (TW)

( * ) Notice: Subject to any disclaimer, the term of this patent is extended or adjusted under 35 U.S.C. 154(b) by 345 days.

(21) Appl. No.: 12/780,938

(22) Filed: May 17, 2010

(65) Prior Publication Data
US 2011/0280075 A1    Nov. 17, 2011

(51) Int. Cl.
*G11C 16/04* (2006.01)
(52) U.S. Cl. .......... 365/185.17; 365/185.05; 365/185.29
(58) Field of Classification Search ............. 365/185.17, 365/185.14, 185.15, 185.33, 185.05, 185.22, 365/185.29, 230.06, 230.08
See application file for complete search history.

(56) References Cited

U.S. PATENT DOCUMENTS

| | | | |
|---|---|---|---|
| 7,615,447 B2 * | 11/2009 | Purayath et al. | 438/257 |
| 7,796,432 B2 * | 9/2010 | Kim et al. | 365/185.17 |
| 7,812,390 B2 * | 10/2010 | Park et al. | 257/315 |
| 2009/0122613 A1 | 5/2009 | Kim et al. | |
| 2010/0109627 A1 * | 5/2010 | Umezawa et al. | 323/282 |
| 2010/0117141 A1 * | 5/2010 | Shin et al. | 257/326 |
| 2010/0172182 A1 * | 7/2010 | Seol et al. | 365/185.17 |
| 2011/0018051 A1 * | 1/2011 | Kim et al. | 257/324 |

OTHER PUBLICATIONS

Article Titled "Multi-Layered Vertical Gate NAND Flash Overcoming Stacking Limit for Terabit Density Storage", jointly authored by W. Kim et al. in Symposium on VLSI Technology Digest of Technical Papers, pp. 188-189, 2009.

* cited by examiner

*Primary Examiner* — Gene Auduong
(74) *Attorney, Agent, or Firm* — Jianq Chyun IP Office

(57) ABSTRACT

The invention provides a memory device on a substrate. The memory device comprises semiconductor layers, common word lines, common bit lines and a common source line. The semiconductor layers are stacked on the substrate, wherein each semiconductor layer has a plurality of NAND strings, and each NAND string includes memory cells and at least a string selection transistor. The common word lines are configured above the semiconductor layers, wherein each common word line is coupled to the memory cells arranged in a same row of the semiconductor layers. The common bit lines are configured on the common word lines, wherein each common bit line is coupled to a first ends of the NAND strings arranged in the same column of the semiconductor layers. The common source line is configured on the common word lines and coupled to a second ends of the NAND strings of the semiconductor layers.

24 Claims, 19 Drawing Sheets

MEMORY DEVICE AND OPERATING METHOD THEREOF

BACKGROUND OF THE INVENTION

1. Field of Invention

The present invention relates to a memory device. More particularly, the present invention relates to a memory device having 3-D NAND strings.

2. Description of Related Art

There are many different types of memory including random-access memory (RAM), read only memory (ROM), dynamic random access memory (DRAM), synchronous dynamic random access memory (SDRAM) and flash memory. Flash memory devices become popular sources of non-volatile memories and are widely used in the personal computers, personal digital assistants (PDAs), digital cameras, digital media players, cellular phones and removable memory modules. Moreover, a NAND memory device is the common type of flash memory device. The array of memory cells of NAND flash memory devices is arranged in a form that the control gate of each of the memory cells of the row of the array is connected to the a word line. Columns of the array include strings (i.e. NAND strings) of memory cells which are connected in series between the selection lines including source side selection line and string selection line. Currently, with the demands of higher capacity and smaller size of non-volatile memories, a non-volatile memory device including a 3-D NAND string stack structure has been developed.

In the conventional 3-D NAND string stack structure, the bit lines, the string selection line, the word lines, the source side selection line and the source line are configured in the substrate or the material layer below the stacked semiconductor layers which are used to form NAND strings thereon. That is, the string selection line, the word lines and the source side selection line are formed in the substrate or the material layer before the semiconductor layers are deposited and are patterned. According to the manufacturing process, the bit lines, the string selection line, the word lines, the source side selection line and the source line cannot be made of metal material because of contamination issue and low thermal budget after the deposition of the metal layer. Thus, the bit lines, the string selection line, the word lines, the source side selection line and the source line are made of doped polysilicon instead of metal material. Hence, the sheet resistance of the line cannot be reduced. Therefore, the speed of programming operation and reading operation is slow.

Moreover, after the semiconductor layers and the charge trapping layers are formed, the vertical gates are formed to couple the memory cells of the NAND strings to the word lines under the semiconductor layers. However, the formation of the contact holes of the vertical gates must be done without miss-alignment to the word lines underneath the semiconductor layers. Therefore, the line pitch and spaces between the word lines are limited and are unable to be scaled down.

SUMMARY OF THE INVENTION

Accordingly, at least one objective of the present invention is to provide a memory device having common bit lines, common word lines and source line made of metal material.

At least another objective of the present invention is to provide an operation method of a memory device capable of improving the operation speed of the memory device.

The invention provides a memory device on a substrate. The memory device comprises a plurality of semiconductor layers, a plurality of common word lines, a plurality of common bit lines and a common source line. The semiconductor layers are stacked on one another on the substrate, wherein each of the semiconductor layers has a plurality of NAND strings, and each of the NAND strings includes a plurality of memory cells and at least a string selection transistor, and each of the NAND strings has a first end and a second end. The common word lines are configured above the semiconductor layers, wherein each of the common word lines is coupled to the memory cells arranged in a same row of the semiconductor layers, and the memory cells coupled to the same common word line and located in different semiconductor layers share the same common word line as a gate. The common bit lines are configured on the common word lines, wherein each of the common bit lines is coupled to the first ends of the NAND strings arranged in the same column of the semiconductor layers. The common source line is configured on the common word lines, wherein the common source line is coupled to the second ends of the NAND strings of the semiconductor layers.

According to one embodiment of the present invention, each of the common word lines is composed of a top metal layer and a bottom polysilicon layer.

According to one embodiment of the present invention, the top metal layer is made of tungsten, cobalt, nickel or tungsten silicide.

According to one embodiment of the present invention, each of the memory cells is composed of an active area extending along a first direction, a first gate line extending along a second direction perpendicular to the first direction, a second gate line extending along third direction parallel to the second direction and a charge trapping structure, and the first gate line and the second gate line are configured at two opposite sides of the active area and the charge trapping structure is configured between the active area and the first gate line and between the active area and the second gate line.

According to one embodiment of the present invention, the charge trapping structure comprises a first insulating layer, a charge trapping layer and a second insulating layer stacked on one another in sequence.

According to one embodiment of the present invention, each of the NAND strings comprises at least a source side selection transistor configured at the second end of the NAND string and between the memory cells and the common source line.

According to one embodiment of the present invention, a number of the string selection transistors of each of the NAND strings is equal to a number of the semiconductor layers.

According to one embodiment of the present invention, the memory device further comprises a least a string selection line coupled to the string selection transistors arranged in a same row of the semiconductor layers.

According to one embodiment of the present invention, each of the common bit lines is coupled to the first ends of the NAND strings arranged in the same column of the semiconductor layers through a bit line contact and a bit line contact area between the bit line contact and each of the first ends of the NAND strings arranged in the same column of the semiconductor layers is a heavily doped area with a single conductive type.

According to one embodiment of the present invention, the common source line is coupled to the second ends of the NAND strings of the semiconductor layers through a source line contact and a source line contact area between the source line contact and each of the second ends of the NAND strings of the semiconductor layers is a heavily doped area with a single conductive type.

The present invention also provides a memory device on a substrate. The memory device comprises a plurality of semiconductor layers, a plurality of common word lines, a plurality of common bit lines and a common source line. The semiconductor layers are stacked on one another on the substrate, wherein each of the semiconductor layers has a plurality of NAND strings, and each of the NAND strings includes a plurality of memory cells and at least a string selection transistor, and each of the NAND strings has a first end and a second end. Each of the common word lines is coupled to the memory cells arranged in a same row of the semiconductor layers. Each of the common bit lines is coupled to the first ends of the NAND strings arranged in the same column of the semiconductor layers through a bit line contact, and a bit line contact area between the bit line contact and each of the first ends of the NAND strings arranged in the same column of the semiconductor layers is a first heavily doped area with a single conductive type. The common source line is coupled to the second ends of the NAND strings of the semiconductor layers through a source line contact and a source line contact area between the source line contact and each of the second ends of the NAND strings of the semiconductor layers is a second heavily doped area with the single conductive type.

According to one embodiment of the present invention, the common word lines are configured above the semiconductor layers, and the common bit lines and the common source line are configured on the common word lines.

According to one embodiment of the present invention, the single conductive type is an N type or P type or intrinsic type without impurity dopant.

According to one embodiment of the present invention, each of the common word lines is composed of a top metal layer and a bottom polysilicon layer, and the material of the top metal layer includes tungsten, cobalt, nickel or tungsten silicide.

According to one embodiment of the present invention, each of the common word lines is composed of a top metal layer and a bottom complex layer, and the material of the top metal layer includes tungsten, cobalt, nickel or tungsten silicide, and the bottom complex layer includes a thin metal layer and a polysilicon layer stacked on the thin metal layer.

According to one embodiment of the present invention, each of the memory cells is composed of an active area extending along a first direction, a first gate line extending along a second direction perpendicular to the first direction, a second gate line extending along third direction parallel to the second direction and a charge trapping structure, and the first gate line and the second gate line are configured at two opposite sides of the active area and the charge trapping structure is configured between the active area and the first gate line and between the active area and the second gate line.

According to one embodiment of the present invention, the charge trapping structure comprises a first insulating layer, a charge trapping layer and a second insulating layer stacked on one another in sequence.

According to one embodiment of the present invention, each of the NAND strings comprises at least a source side selection transistor configured at the second end of the NAND string and between the memory cells and the common source line.

According to one embodiment of the present invention, a number of the string selection transistors of each of the NAND strings is equal to a number of the semiconductor layers.

According to one embodiment of the present invention, the memory device further comprises at least a string selection line coupled to the string selection transistors arranged in a same row of the semiconductor layers.

The present invention further provides a method for operating a memory device. The memory device comprises a plurality of semiconductor stacked layers of a plurality of NAND strings, and each of the NAND strings has a first end and a second end, and each of the NAND strings includes a plurality of memory cells serially connected to one another, and the memory device further comprises a plurality of common word lines, and each of the common word lines is coupled to the memory cells arranged in a same row of the semiconductor layers. The method comprises performing an erasing operation on the memory cells of a selected NAND string from the NAND strings. The erasing operation comprises applying a first voltage on the common word lines respectively coupled to the memory cells of the selected NAND strings to be erased and applying a second voltage on a common source line coupled to the second end of the selected NAND string. The memory cells of the selected NAND string are sequentially erased from the first end to the second end of the selected NAND string if the common word lines are sequentially grounded from the first end to the second end of the selected NAND string. The memory cells of the selected NAND string are sequentially erased from the second end to the first end of the selected NAND string if the common word lines are sequentially grounded from the second end to the first end of the selected NAND string. The memory cells selected from the memory cells of the selected NAND string are selectively erased if the common word lines respectively coupled to the selected memory cells are grounded at the same time. A continuous portion of memory cells of the selected NAND string are erased if the common word lines respectively coupled to the continuous portion of the memory cells are grounded at the same time. All of the memory cells of the selected NAND string are erased at the same time if the common word lines respectively coupled to the memory cells of the selected NAND string are all grounded at the same time.

According to one embodiment of the present invention, the first voltage is lower than or equal to the second voltage and is higher than zero voltage.

According to one embodiment of the present invention, a common bit line coupled to the first end of the selected NAND string is at a floating state.

According to one embodiment of the present invention, the NAND string further includes at least a string selection transistor beside the first end and at least a source side selection transistor beside the second end, and the memory cells are located between the string selection transistor and the source side selection transistor, and the step of applying the first voltage on the common word line respectively coupled to the memory cells of the NAND string further comprises applying the first voltage on a source side selection line coupled to the source side selection transistor and on string selection lines coupled to the string selection transistors.

In the present invention, the common bit lines, the common word lines, the string selection lines, the source side selection line and the common source line are configured above the whole semiconductor layers. Therefore, the material of the common bit lines, the common word lines, the string selection lines, the source side selection line and the common source line are not limited to the thermal budget of the manufacturing process of the memory device. In other words, the common bit lines, the common word lines, the string selection lines, the source side selection line and the common source line can be made of metal material. Thus, the operation speed of the memory device is improved. Furthermore, since the formations of the semiconductor layers and the charge trapping structure are not limited by the small thermal budget, the bottom insulating layer/the first insulating layer can be made of thermal oxide. Therefore, the leakage current of the first insulating layer can be effectively suppressed. Further, the reliability of the memory cell is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 4A though 9A are cross-sectional views along line A-A' of FIG. 2 for showing a method for manufacturing the memory device according to one embodiment of the present invention.

FIGS. 4B through 7B are cross-sectional views along line B-B' of FIG. 2 showing the process steps for forming a primary structure of the memory device before the common source line and the common bit lines are formed.

DESCRIPTION OF THE PREFERRED EMBODIMENTS

Figure 1:
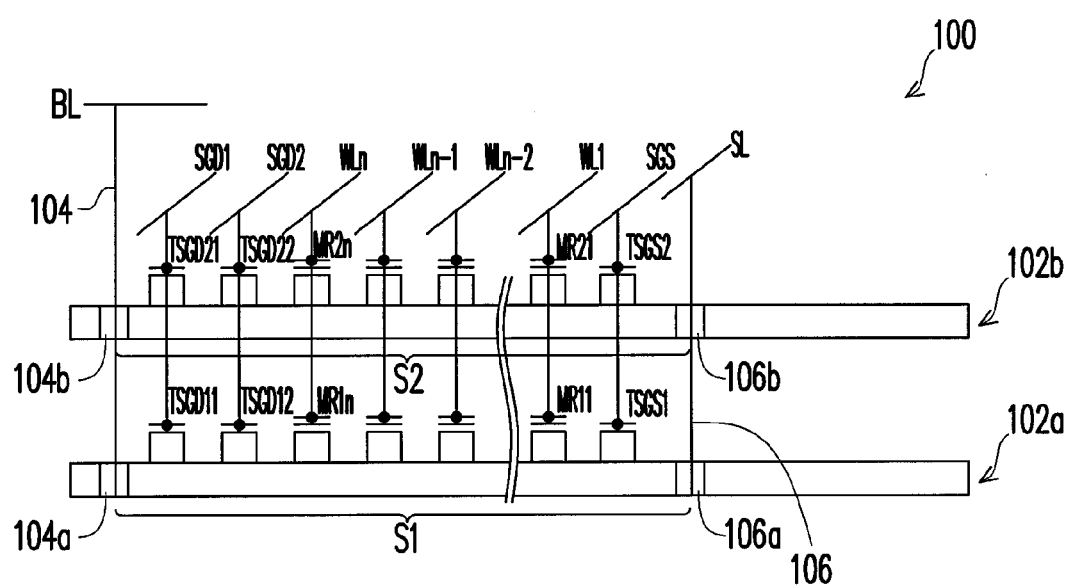
FIG. 1 is an equivalent circuit diagram of a memory device having 3-D NAND strings according to one embodiment of the present invention.

FIG. 1 is an equivalent circuit diagram of a memory device having 3-D NAND strings according to one embodiment of the present invention. As shown in FIG. 1, a memory device 100 of the present embodiment comprises a plurality of semiconductor layers stacked on one another. It should be noticed that only two semiconductor layers 102a and 102b are drawn in FIG. 1 and are the exemplar of the present invention. That is, the number of the semiconductor layers shown in FIG. 1 does not limit the scope of the present invention, and the number of the semiconductor layers can be varied according to the practical requirements. In addition, in the present embodiment, each of the semiconductor layers 102a and 102b can be, for example but not limited to, an active layer made of polysilicon such as lightly doped polysilicon with conductive type such as N type or P type. In another embodiment, each of the semiconductor layers 102a and 102b can be, for example but not limited to, an active layer made of intrinsic-type polysilicon. That is, the active layer can be formed without having any impurity dopant therein.

Furthermore, as shown in FIG. 1, each of the semiconductor layers 102a and 102b has a plurality of NAND strings, such as the NAND string S1 of the semiconductor layer 102a and the NAND string S2 of the semiconductor layer 102b. It should be noticed that each of the semiconductor layers 102a and 102b having only one NAND string are drawn in FIG. 1 and are simply an exemplar of the present invention. In other words, the number of the NAND strings of each of the semiconductor layers shown in FIG. 1 is not used to limit the present invention, and the number of the NAND strings of each of the semiconductor layers can be varied according to the practical requirements.

Moreover, still shown in FIG. 1, each of the NAND strings includes a plurality of memory cells. More clearly, the NAND string S1 comprises the memory cells MR11 through MR1$n$, and the NAND string S2 comprises the memory cells MR21 through MR2$n$. In addition, each of the NAND strings includes at least one string selection transistor and at least one source side selection transistor. Specifically, the NAND string S1 comprises the string selection transistors TSGD11 and TSGD 12, and the NAND string S2 comprises the string selection transistors TSGD 21 and TSGD 22. Also, the NAND string S1 comprises the source side selection transistor TSGS1, and the NAND string S2 comprises the source side selection transistors TSGS2. Noticeably, a number of the string selection transistors of each of the NAND strings is equal to a number of the semiconductor layers. That is, as shown in FIG. 1, there are two semiconductor layers 102a and 102b stacked on one another so that, for each of the NAND strings S1 and S2 respectively on the semiconductor layers 102a and 102b, there are two string selection transistors. Moreover, for each of the NAND strings, only one of the string selection transistors is the enhancement-mode transistor. Accordingly, other than the enhancement-mode transistor, there is at least one depletion-mode transistor among the rest of the string selection transistors. In one embodiment of the present invention, all of the string selection transistors other than the enhancement-mode transistor can be, for example, the depletion-mode transistors. Furthermore, it should be noticed that, for the NAND strings arranged in the same column of the semiconductor layers but located at different semiconductor layers, the enhancement-mode transistors of the NAND strings are arranged in different rows of the semiconductor layers.

In addition, for each of the NAND strings, the memory cells are serially connected to one another and are configured between the string selection transistor and the source side selection transistor. Specifically, as shown in FIG. 1, as for the NAND string S1, the memory cells MR11 through MR1$n$ are configured between the source side selection transistor TSGS1 and the string selection transistors TSGD11 and TSGD12. Similarly, as for the NAND string S2, the memory cells MR21 through MR2$n$ are configured between the source side selection transistor TSGS2 and the string selection transistors TSGD21 and TSGD22.

Furthermore, for the sake of detailing the structure of the memory device in the following description, the end of each of the NAND strings closed to the string selection transistor is denoted as a first end of the NAND string and the end of each of the NAND strings closed to the source side selection transistor is denoted as a second end of the NAND string. However, the aforementioned denominations of the ends of each of the NAND strings are not used to limit the present invention.

Please referring to FIG. 1, the memory device 100 further comprises a plurality of common word lines WL1 through WLn configured at a height level higher than the height level of the topmost layer of the semiconductor layers 102a and 102b. In other words, the common word lines WL1 through WLn are configured on a layer above the semiconductor layers of the NAND strings. Also, it should be noticed that each of the common word lines WL1 through WLn is respectively coupled to the memory cells arranged in a same row of the semiconductor layers 102a and 102b. Furthermore, the memory cells coupled to the same common word line and located in different semiconductor layers share the same common word line as the gate. Taking the common word line WLn shown in FIG. 1 as an example, the memory cell MR1n of the NAND string S1 of the semiconductor layer 102a and the memory cell MR2n of the NAND string S2 of the semiconductor layer 102b are arranged in the same row of the semiconductor layers 102a and 102b and share the same common word line WLn as the gate. Also, in an embodiment of the present invention, the common word lines can be made of, for example but not limited to, doped polysilicon, such as heavily doped polysilicon with N type or P type. In addition, in another embodiment, a portion of each of the common word lines over the semiconductor layers can be composed of, for example, a top metal layer and a bottom polysilicon layer. The aforementioned top metal layer can be made of, for example but not limited to, tungsten, cobalt, nickel or metal silicide such as tungsten silicide. Also, the aforementioned bottom polysilicon layer can be, for example, a heavily doped polysilicon layer with N type or P type. In the other embodiment, the portion of each of the common word lines over the semiconductor layers can be composed of, for example, a top metal layer and a bottom complex layer, which is composed of a thin metal layer and a polysilicon layer stacked on the thin metal layer. The aforementioned polysilicon layer can be, for example, a heavily doped polysilicon layer with N type or P type. The thin metal layer can be made of, for example but not limited to, tantalum nitride or titanium nitride.

In addition, as shown in FIG. 1, the memory device 100 of the present embodiment further comprises at least one string selection line coupled to the string selection transistors arranged in the same row of the semiconductor layers. That is, the string selection transistor TSGD11 of the NAND string of the semiconductor layer 102a and the string selection transistor TSGD21 of the NAND string of the semiconductor layer 102b share the same string selection line SGD1 and the string selection transistor TSGD12 of the NAND string of the semiconductor layer 102a and the string selection transistor TSGD22 of the NAND string of the semiconductor layer 102b share the same string selection line SGD2. Also, in an embodiment of the present invention, the string selection lines (such as the string selection lines SGD1 and SGD2) can be made of, for example but not limited to, doped polysilicon, such as heavily doped polysilicon with N type or P type. In addition, in another embodiment, a portion of the string selection lines over the semiconductor layers can be composed of, for example, a top metal layer and a bottom polysilicon layer. The aforementioned top metal layer can be made of, for example but not limited to, tungsten, cobalt or nickel. Also, the aforementioned bottom polysilicon layer can be, for example, a heavily doped polysilicon layer with N type or P type. In the other embodiment, the portion of the string selection lines over the semiconductor layers can be composed of, for example, a top metal layer and a bottom complex layer, which is composed of a thin metal layer and a polysilicon layer stacked on the thin metal layer. The aforementioned polysilicon layer can be, for example, a heavily doped polysilicon layer with N type or P type. The thin metal layer can be made of, for example but not limited to, tantalum nitride or titanium nitride.

Also, the memory device 100 of the present embodiment comprises at least one source side selection line coupled to the source side selection transistors arranged in the same row of the semiconductor layers. That is, the source side selection transistor TSGS1 of the NAND string of the semiconductor layer 102a and the source side selection transistor TSGS2 of the NAND string of the semiconductor layer 102b share the source side selection line SGS. Further, in an embodiment of the present invention, the source side selection lines (such as the source side selection lines SGS1 and SGS2) can be made of, for example but not limited to, doped polysilicon, such as heavily doped polysilicon with N type or P type. In addition, in another embodiment, a portion of the source side selection lines over the semiconductor layers can be composed of, for example, a top metal layer and a bottom polysilicon layer. The aforementioned top metal layer can be made of, for example but not limited to, tungsten, cobalt or nickel. Also, the aforementioned bottom polysilicon layer can be, for example, a heavily doped polysilicon layer with N type or P type. In the other embodiment, the portion of the source side selection lines over the semiconductor layers can be composed of, for example, a top metal layer and a bottom complex layer, which is composed of a thin metal layer and a polysilicon layer stacked on the thin metal layer. The aforementioned polysilicon layer can be, for example, a heavily doped polysilicon layer with N type or P type. The thin metal layer can be made of, for example but not limited to, tantalum nitride or titanium nitride.

Moreover, as shown in FIG. 1, the memory device 100 of the present embodiment also comprises a plurality of common bit lines BL configured on the common word lines WL1 through WLn, on the string selection lines SGD1 and SGD2 and on the source side selection line SGS. In other words, the common bit lines BL are configured at a height level above that of the common world lines WL1 through WLn, the string selection lines SGD1 and SGD2 and the source side selection line SGS. Noticeably, each of the common bit lines BL is coupled to the first ends of the NAND strings arranged in the same column of the semiconductor layers. Taking the NAND strings S1 and S2 shown in FIG. 1 as an example, the NAND strings S1 and S2 are arranged in the same column of the semiconductor layers 102a and 102b so that the common bit line BL is coupled to both of the first ends of the NAND strings S1 and S2. In one embodiment of the present invention, each of the common bit lines is coupled to the first ends of the NAND strings arranged in the same column of the semiconductor layers through a bit line contact. Taking the NAND string S1 and the NAND string S2 as examples, the common bit line BL is coupled to the first ends of both of the NAND string S1 and NAND string S2 commonly through a bit line contact 104. Moreover, a bit line contact area 104a between the bit line contact 104 and the first end of the NAND string S1 and a bit line contact area 104b between the bit line contact 104 and the first end of the NAND string S2 which are arranged in the same column of the semiconductor layers are doped areas with a single conductive type. Furthermore the heavily doped areas are respectively formed in the bit line contact 104 as well as the semiconductor layers 102a and 102b. The single conductive type means the doped area is formed with the dopants having only one conductive type.

More specifically, the aforementioned doped areas can be, for example, heavily doped areas having dopants with a relatively high dopant concentration and the single conductive type. The single conductive type can be, for example, N type or P type. It should be noticed that, when the semiconductor layers 102a and 102b are made of lightly doped polysilicon, the single conductive type of each of the bit line contact areas (such as the bit line contact areas 104a and 104b) is as same as the conductive type of the semiconductor layers 102a and 102b. In another embodiment, when the semiconductor layers 102a and 102b are made of intrinsic-type polysilicon without having any dopant therein, the bit line contact areas (such as the bit line contact areas 104a and 104b) can be intrinsic-type doped regions or heavily doped regions with conductive type such as N type or P type.

Further, as shown in FIG. 1, the memory device 100 of the present embodiment comprises a common source line SL configured on the common word lines WL1 through WLn, on the string selection lines SGD1 and SGD2 and on the source side selection line SGS. In other words, the common source line SL is configured at a height level above that of the common world lines WL1 through WLn, the string selection lines SGD1 and SGD2 and the source side selection line SGS. Furthermore, the common source line SL is configured at the height level below the height level of the common bit lines BL. It should be noticed that the common source line SL is coupled to the second ends of the NAND strings of the semiconductor layers. Thus, the source side selection transistor of each of the NAND strings is located between the memory cells and the common source line. In one embodiment of the present invention, the common source line SL is coupled to the second ends of the NAND strings of the semiconductor layers through a source line contact. Taking the NAND string S1 and the NAND string S2 as examples, the common source line SL is coupled to the second ends of both of the NAND strings S1 and S2 commonly through a source line contact 106. Moreover, a source line contact area 106a between the source line contact 106 and the second end of the NAND string S1 and a source line contact area 106b between the source line connect 106 and the NAND string S2 are the doped areas with the single conductive type. Further, the doped areas are respectively formed in the source line contact 106 as well as the semiconductor layers 102a and 102b. More specifically, the aforementioned doped areas can be, for example, heavily doped areas having dopants with a relatively high dopant concentration and the single conductive type. It should be noticed that, when the semiconductor layers 102a and 102b are made of lightly doped polysilicon, the single conductive type of each of the source line contact areas (such as the source line contact areas 106a and 106b) is as same as the conductive type of the semiconductor layers 102a and 102b. In another embodiment, when the semiconductor layers 102a and 102b are made of intrinsic-type polysilicon without having any dopant therein, the source line contact areas (such as the source line contact areas 106a and 106b) can be intrinsic-type doped regions or heavily doped regions with conductive type such as N type or P type.

Figure 2:
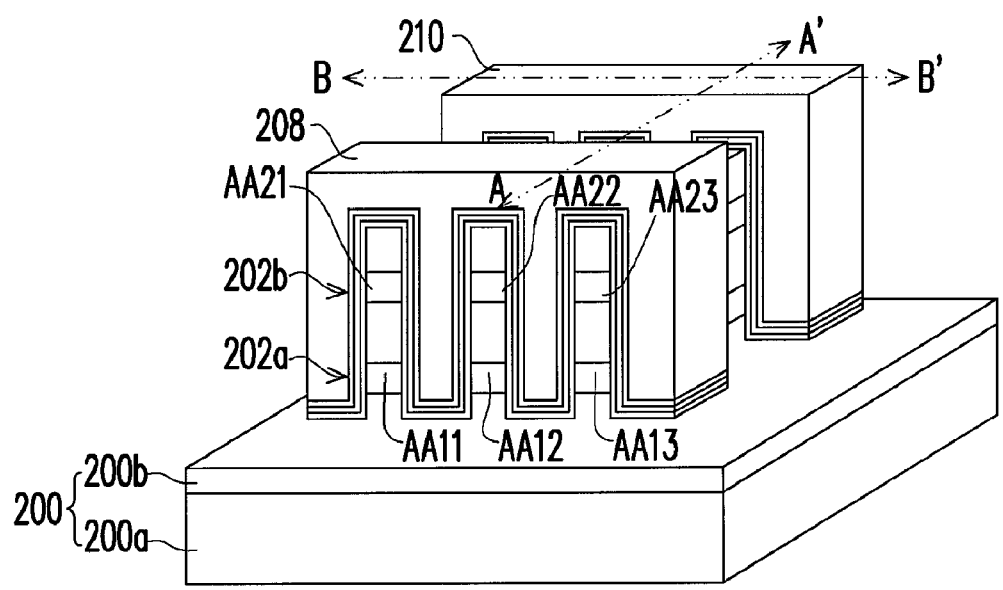
FIG. 2 is a schematic 3-D view showing memory cells of the memory device of FIG. 1.
Figure 2A:
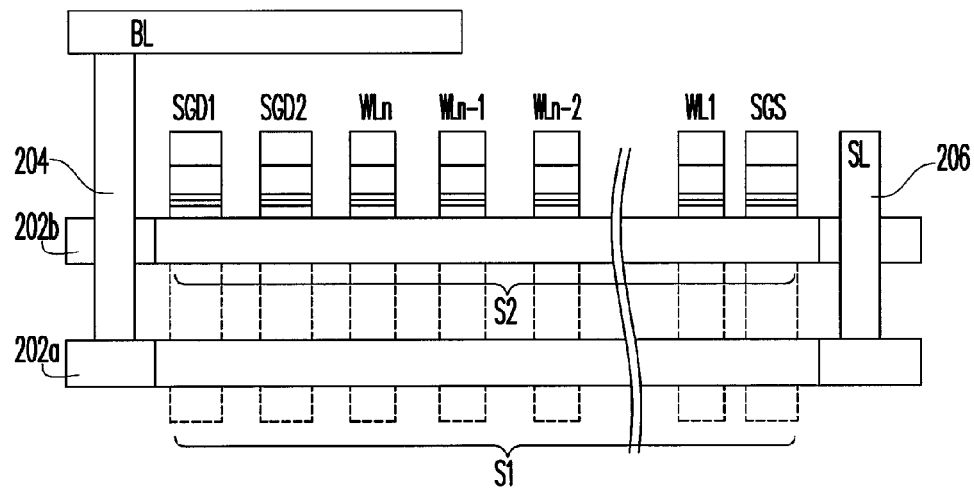
FIG. 2A is a cross-sectional view of FIG. 2 along a line A-A'.

The following descriptions accompanied with FIG. 2 which is schematic 3-D view showing memory cells of the memory device of FIG. 1. FIG. 2A which is a cross-sectional view of FIG. 2 along a line A-A', FIG. 2B which is a cross-sectional view of FIG. 2 along a line B-B' and FIG. 3 which is a schematic top view of the memory device shown in FIG. 2A are used to further detail the structure of the memory cells of the memory device of the present invention. It should be noticed that, for simplifying the drawing, the dielectric layers formed between the semiconductor layers/active layers, between the bit lines, the common word lines and the common source lines and between the common word lines are omitted. As shown in FIG. 2, in the present embodiment, the memory cells are arranged in an array and are configured on a substrate 200. The substrate 200 can be, for example but not limited to, a silicon-on-insulator (SOI) substrate. In other words, the substrate 200 can be composed of a silicon substrate 200a and an insulating layer 200b stacked on the silicon substrate 200a. On the substrate 200, there is a plurality of active layers (i.e. the semiconductor layers shown in FIG. 1) stacked on one another. The materials of the active layers have been already mentioned in the above embodiment and are not repeatedly described herein. It should be noticed that in the present embodiment shown in FIG. 2, only two layers of active layers 202a and 202b are stacked over the substrate 200 and the number of the active layers shown in FIG. 2 does not limit the scope of the present invention. In other words, the number of the active layers can be varied according to the practical requirement. Furthermore, each of the active layers 202a and 202b is composed of a plurality of rectangular active area regions for forming NAND strings respectively. That is, in the exemplar shown in FIG. 2, the active layer 202a is composed of the active area regions AA11, AA12 and AA13 and the active layer 202b is composed of the active area regions AA21, AA22 and AA23. Additionally, the active area regions of the same active layer are separated from each other by the common word lines such as the common word lines 208 and 210 shown in FIG. 2.

As shown in FIG. 2A, although the cross-sectional view of FIG. 2 along the line A-A' shows four memory cells of the memory device, the memory cells, the string selection lines SGD1 and SGD2, the source side selection line SGS, the common bit line BL and the common source line SL which are mentioned in the above embodiment along the direction of the line A-A' are also shown in FIG. 2A for giving a more clear picture of the structure of the memory device. By referring to FIG. 2A, it is clear that the common word lines WL1 through WLn, the string selection lines SGD1 and SGD2 and the source side selection line SGS are all configured at a height level above the whole active layers 202a and 202b. Furthermore, the common bit line BL at the line A-A' is at the height level above the height level of the common word lines WL1 through WLn, the string selection lines SGD1 and SGD2 and the source side selection line SGS and further above all of the whole active layers 202a and 202b. Moreover, the common source line SL is at a height level above the height level of the common word lines WL1 through WLn, the string selection lines SGD1 and SGD2 and the source side selection line SGS and further above the whole active layers 202a and 202b but below the height level of the common bit line BL.

Figure 3:
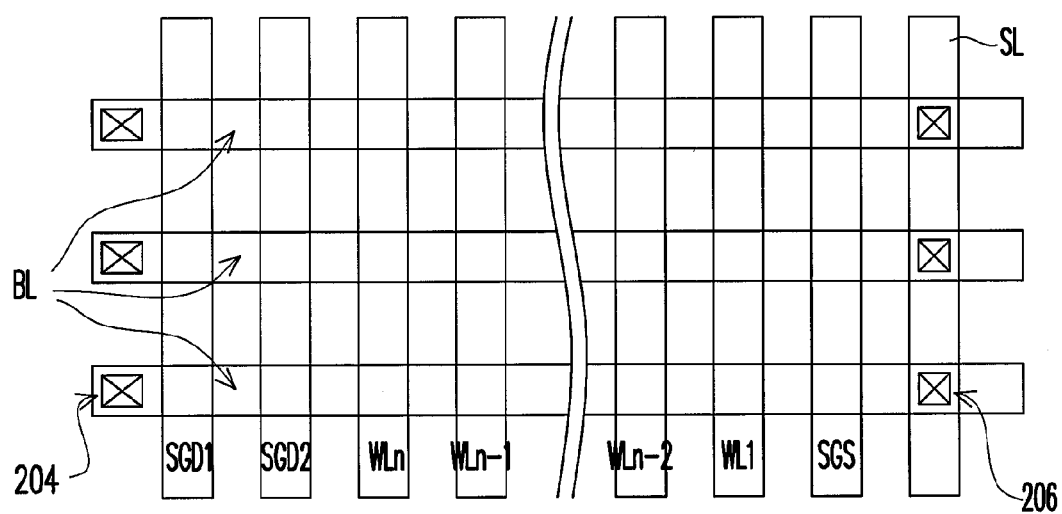
FIG. 3 is a schematic top view of the memory device shown in FIG. 2A.

Further, as shown in FIG. 2A and FIG. 3, it is clear that the common bit line BL is coupled to both of the NAND strings S1 and S2 at the active layers 202a and 202b through a bit line contact 204. In other words, the bit line contact 204 penetrates through the active layers 202b and 202a. Also, as shown in FIG. 2A and FIG. 3, the common source line SL is coupled to both of the NAND strings S1 and S2 at the active layers 202a and 202b through a source line contact 206. That is, the source line contact 206 penetrates through the active layers 102ba and 102a.

Figure 2B:
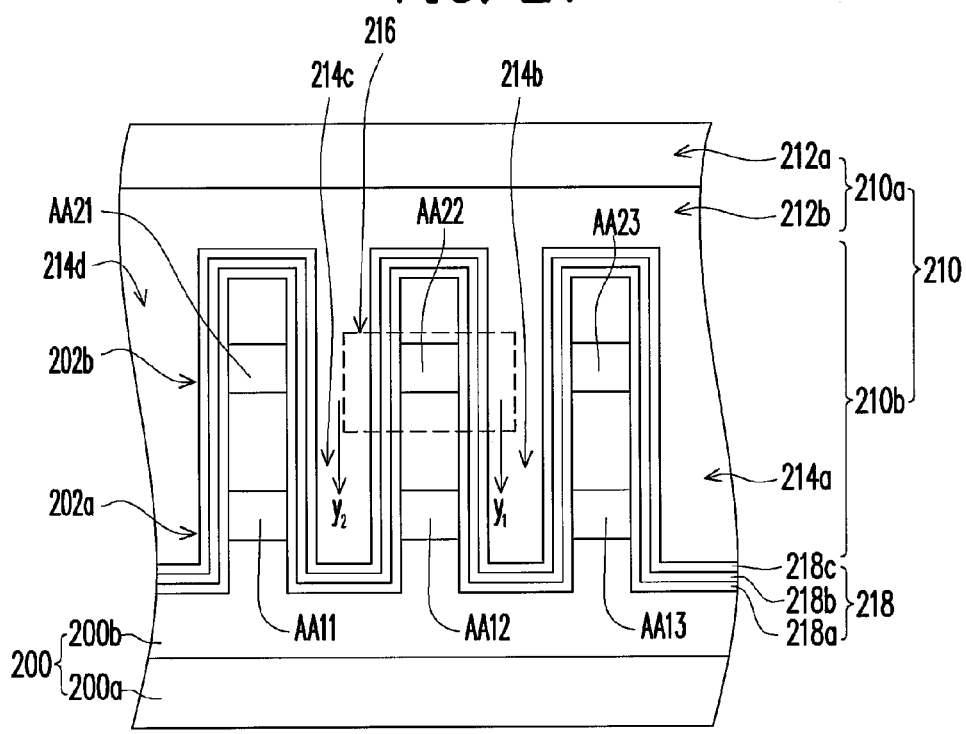
FIG. 2B is a cross-sectional view of FIG. 2 along a line B-B'.

Additionally, in the present embodiment shown in FIG. 2 and FIG. 2B, each of the common word lines 208 and 210 can be made of, for example but not limited to, polysilicon. Specifically, the common word lines can be made of, for example but not limited to, doped polysilicon, such as heavily doped polysilicon with N type or P type. In addition, in another embodiment, in FIG. 2B, the common word line 210 can comprises a top word line portion 210a crossing over the active layers 202a and 202b and a gate line portion 210b extending from the top layer to the bottom layer of the active layers 202a and 202b. Also, the top word line portion 210a can be composed of, for example but not limited to, a top material layer 212a and a bottom material layer 212b. The top material layer 212a can be made of, for example but not limited to, metal such as tungsten, cobalt or nickel and the bottom material layer 212b can be made of, for example but not limited to, polysilicon such as heavily doped polysilicon with N type or P type. In the other embodiment, the bottom material layer 212b can be, for example, a complex layer, which is composed of a thin metal layer and a polysilicon layer stacked on the thin metal layer. The aforementioned polysilicon layer can be, for example, a heavily doped polysilicon layer with N type or P type. The thin metal layer can be made of, for example but not limited to, tantalum nitride or titanium nitride.

Furthermore, gate line portion 210b comprises a plurality of gate lines (such as the gate lines 214a, 214b, 214c and 214d shown in FIG. 2B). The gate lines (such as the gate lines 214a, 214b, 214c and 214d shown in FIG. 2B) can be made of, for example, polysilicon such as heavily doped polysilicon with N type or P type. In the other embodiment, each of the gate lines can has, for example, a complex structure, which is composed of a thin metal layer and a polysilicon layer stacked on the thin metal layer. The aforementioned polysilicon layer can be, for example, a heavily doped polysilicon layer with N type or P type. The thin metal layer can be made of, for example but not limited to, tantalum nitride or titanium nitride.

Still referring to FIG. 2B, each of the memory cells (such as the memory cell labeled 216 and circled by a dotted line) is composed of an active area AA22 extending along a first direction (such as the direction of the line A-A'), a gate line 214b extending along a second direction y1 pointing to the surface of the substrate 200, a gate line 214c extending along third direction y2 parallel to the second direction y1 and a charge trapping structure 218. It should be noticed that the second direction y1 and the third direction y2 are respectively perpendicular to the first direction.

Moreover, as for the memory cell 216, the gate lines 214b and 214c are configured at two opposite sides of the active area AA22. Further, the charge trapping structure 218 is configured between the active area AA22 and the gate line 214b and between the active area AA22 and the gate line 214c. Noticeably, the charge trapping structure 218 comprises a first insulating layer 218a, a charge trapping layer 218b and a second insulating layer 218c stacked on one another in sequence. The first insulating layer 218a can be made of, for example but not limited to, silicon oxide by a thermal oxidation process. The charge trapping layer 218b can be made of, for example but not limited to, silicon nitride. Further, the second insulating layer 218c can be made of, for example but not limited to, silicon oxide by the thermal oxidation process or the chemical vapor deposition (CVD) process. In one embodiment of the present invention, the second insulating layer 218c can be made of, for example but not limited to, an insulating material with a relatively high dielectric constant.

Figures 4A, 4B:
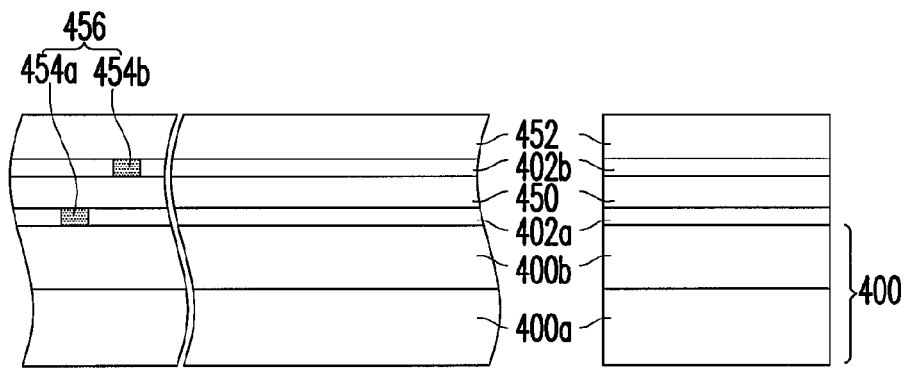
Figure 6A:
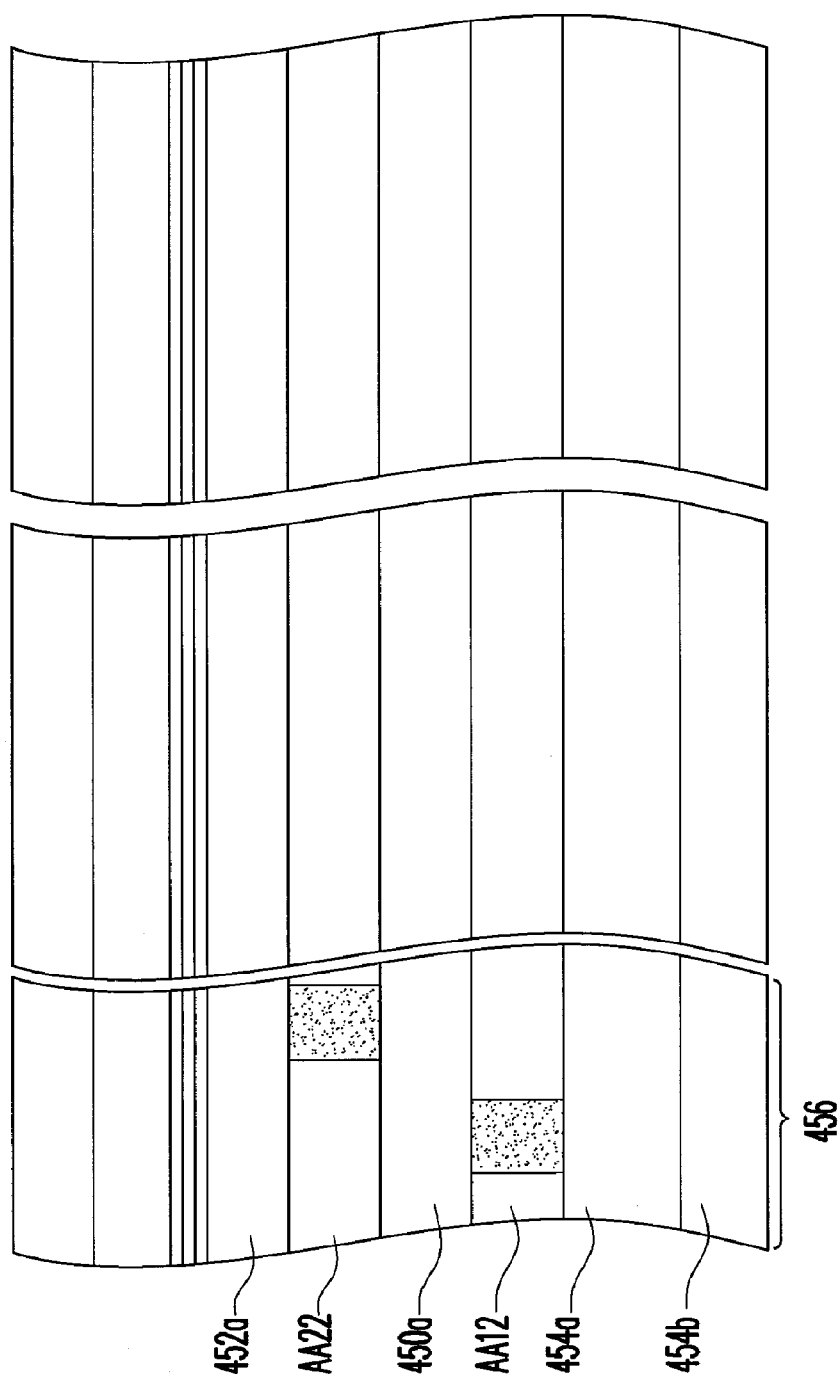
Figure 6B:
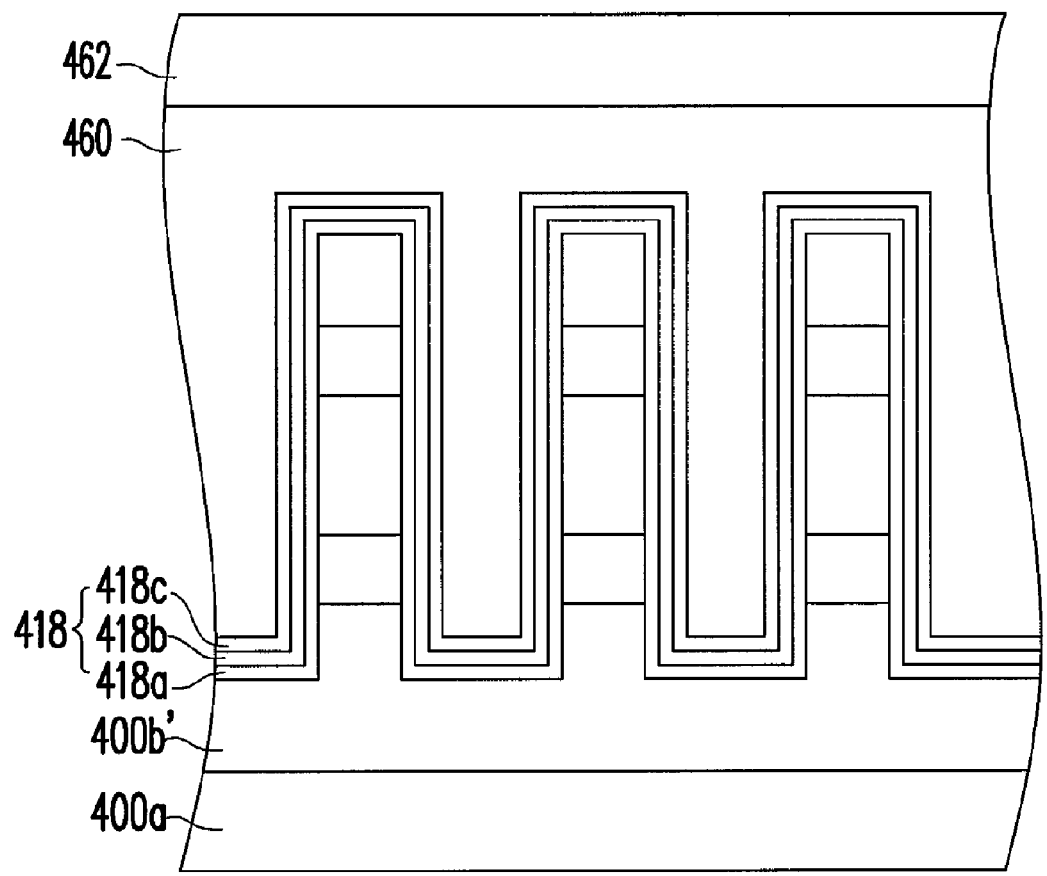
Figure 7A:
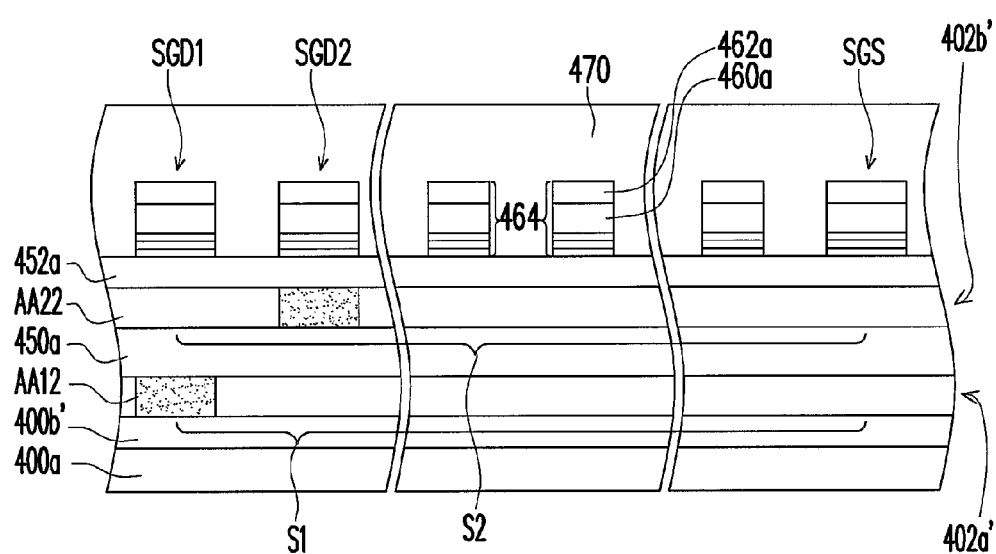
Figure 7B:
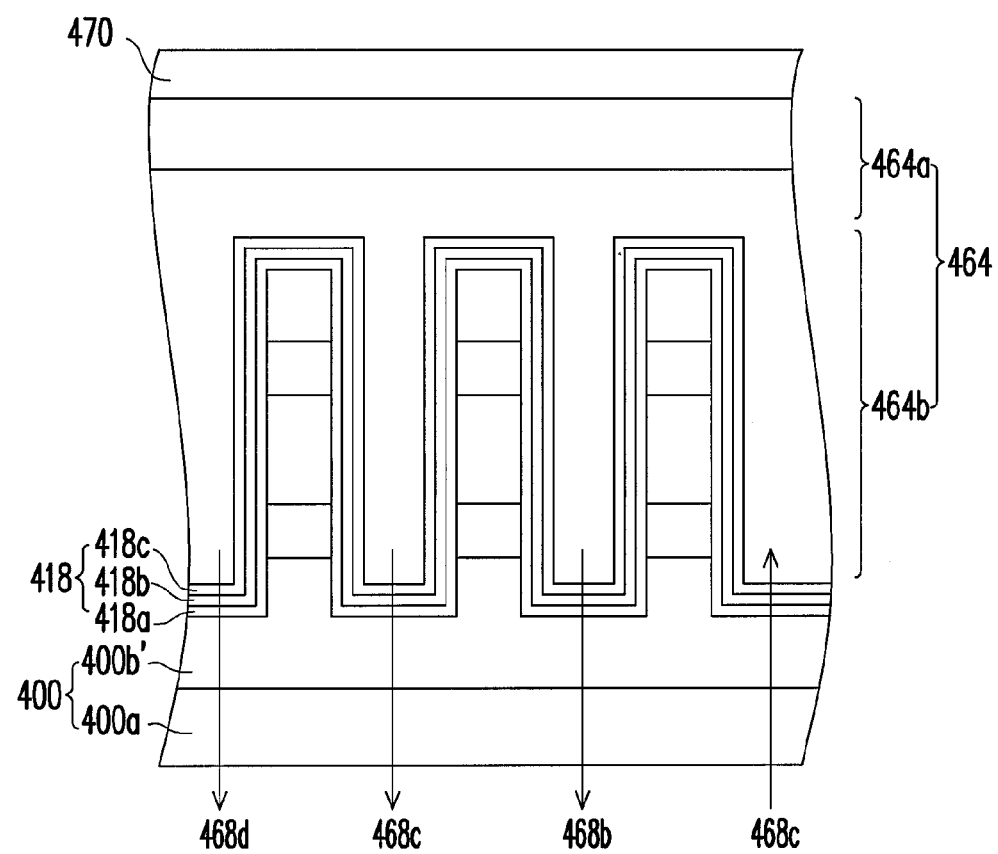
Figure 8A:
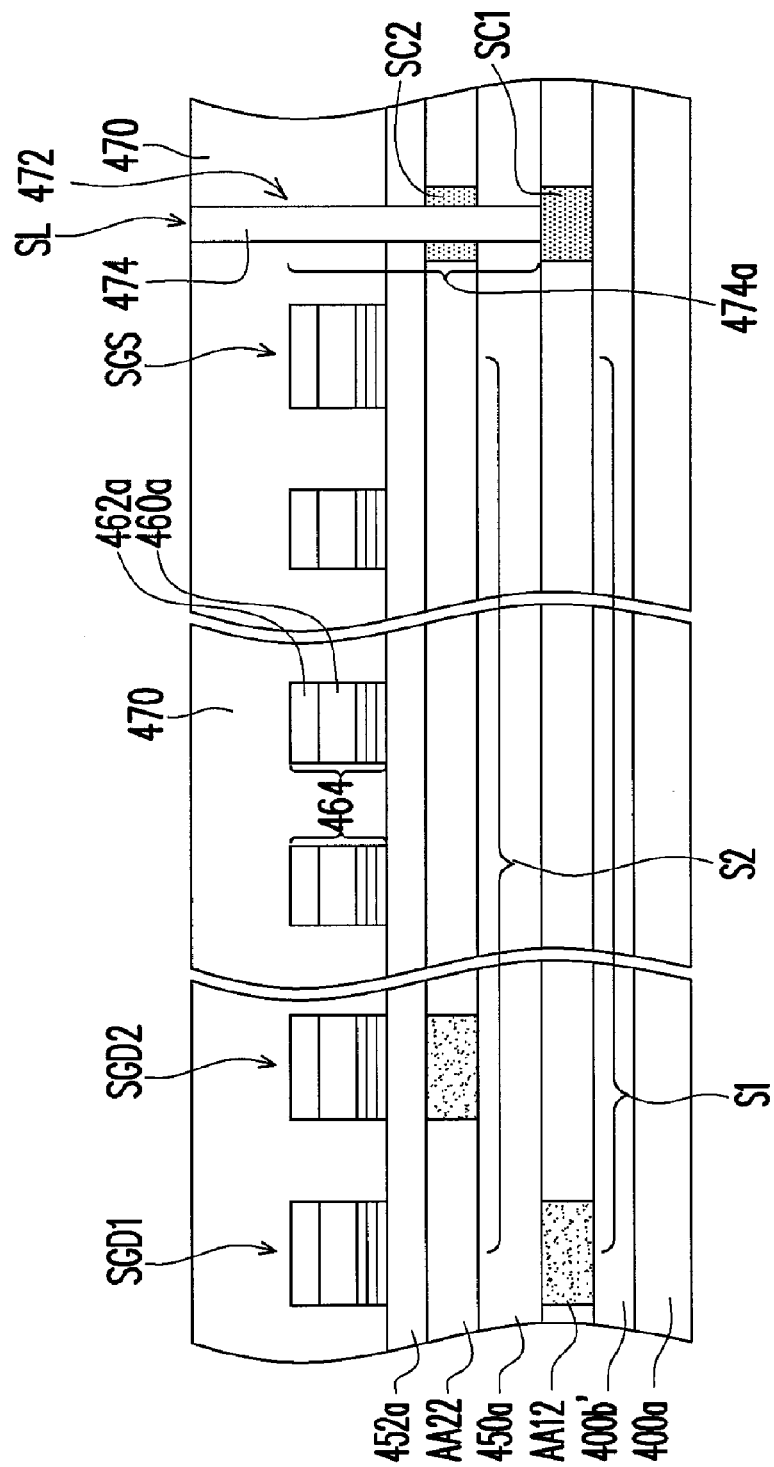
FIG. 8A' is a top view showing a primary structure of the memory device before the common bit lines are formed.
Figure 8A:
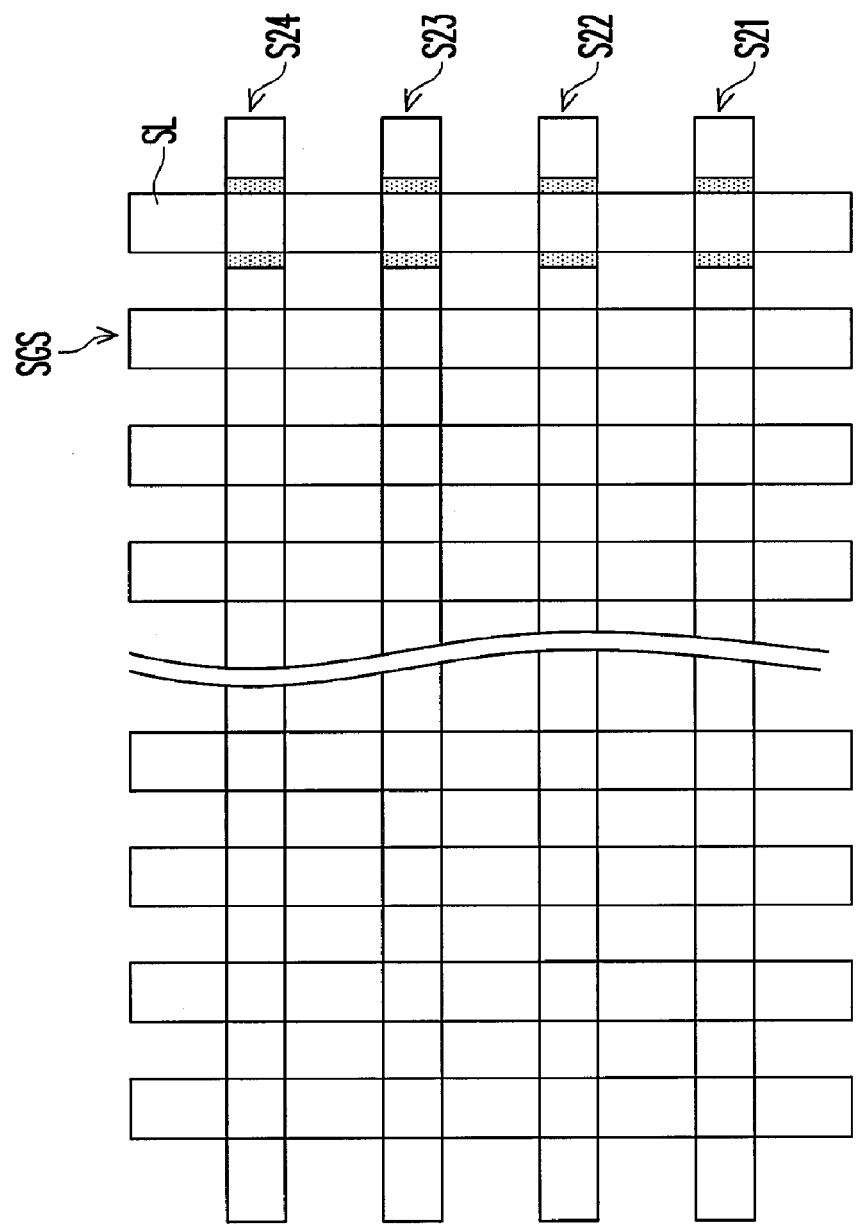
Figure 9A:
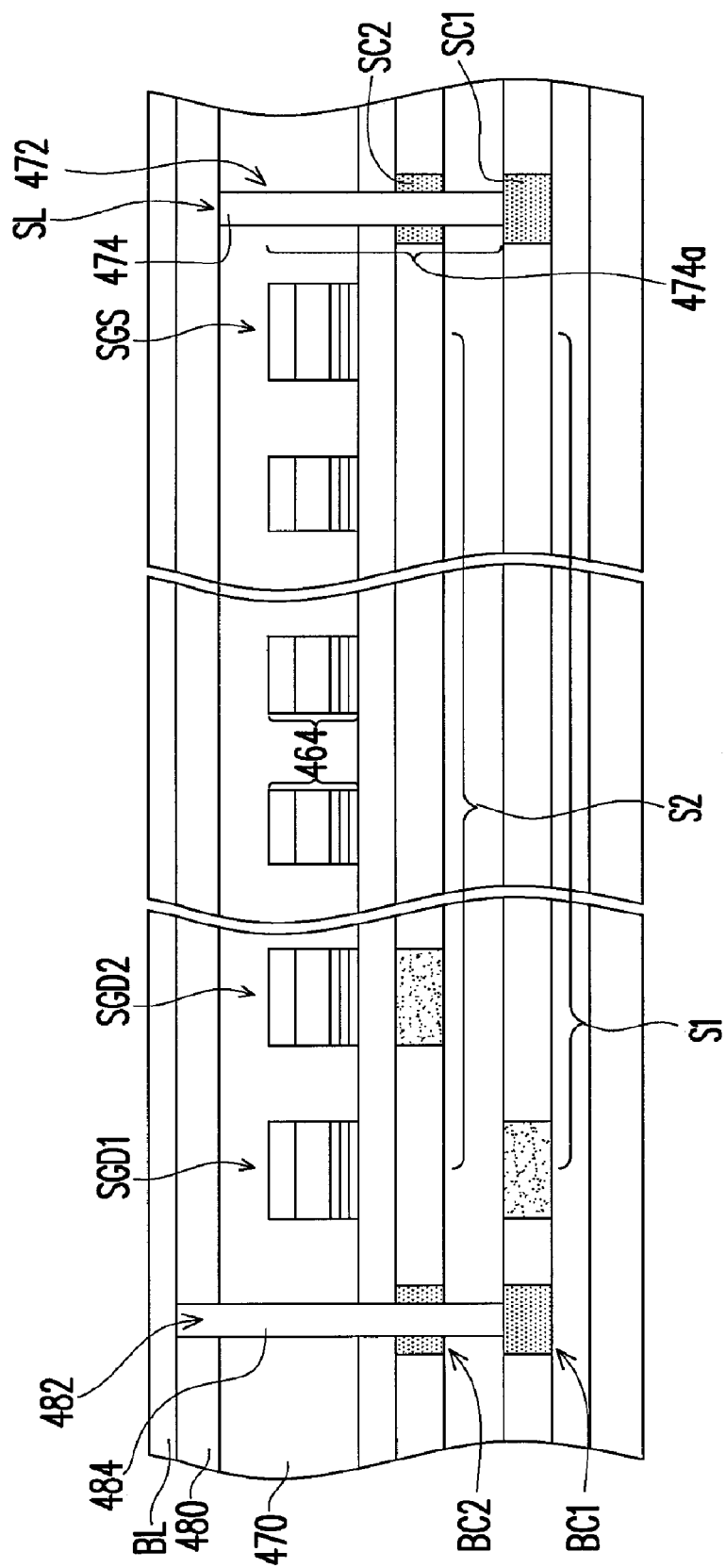
FIG. 9A' is a top view showing the memory device according to one embodiment of the present invention.
Figure 9A:
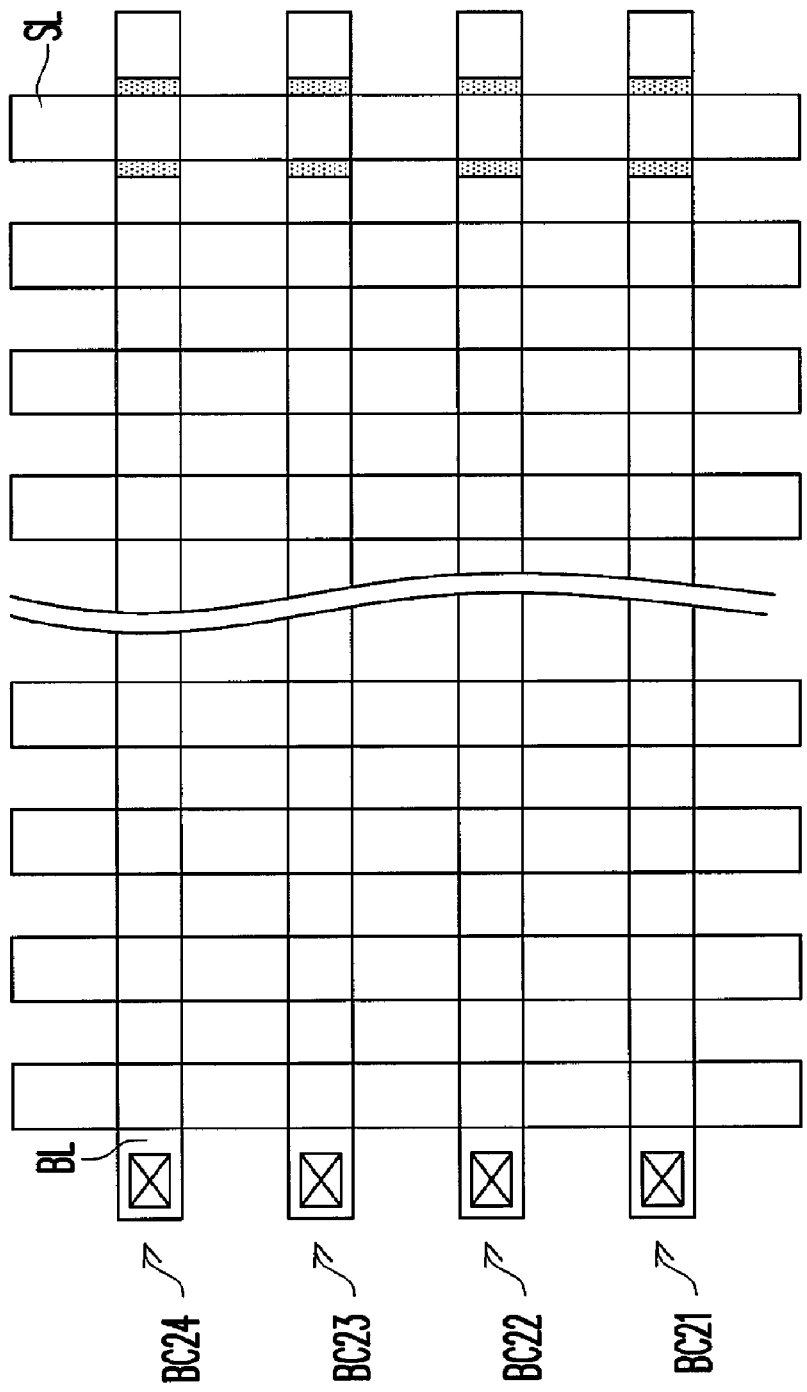

The following descriptions accompanied with FIGS. 4A though 9A, FIGS. 4B through 7B, FIG. 8A' and FIG. 9A' are used to further detail the structure of the memory cells of the memory device of the present invention and the method for manufacturing the memory device of the present invention. FIGS. 4A though 9A are cross-sectional views along line A-A' of FIG. 2 for showing a method for manufacturing the memory device according to one embodiment of the present invention. FIGS. 4B through 7B are cross-sectional views along line B-B' of FIG. 2 showing the process steps for forming a primary structure of the memory device before the common source line and the common bit lines are formed. FIG. 8A' is a top view showing a primary structure of the memory device before the common bit lines are formed. FIG. 9A' is a top view showing the memory device according to one embodiment of the present invention.

As shown in FIG. 4A and FIG. 4B, in the present embodiment, a substrate 400 having a plurality material layers formed thereon is provided. The substrate 400 can be, for example, the substrate having a silicon substrate 400a and an insulating layer 400b stacked on the silicon substrate 400a. The material layers includes an active layer 402a, a dielectric layer 450, an active layer 402b and a dielectric layer 452 which are stacked one another in sequence. It should be noticed that only two active layers 402a and 402b are drawn in FIG. 4A and FIG. 4B and are the exemplar of the present invention. That is, the number of the active layers shown in FIG. 4A and FIG. 4B does not limit the scope of the present invention, and the number of the semiconductor layers can be varied according to the practical requirements. The materials of the dielectric layers 450 and 452 can be, for example, silicon oxide. Furthermore, the materials of the active layers 402a and 402b can be, for example, non-doped polysilicon or lightly doped polysilicon with N type or P type.

It should be noticed that, for each of the active layers 402a and 402b, there is at least one heavily doped region (such as the heavily doped regions 454a and 454b) configured around one region 456, which is used to form the string selection transistors of the NAND strings in later manufacturing process. Further, the at least one heavily doped region in each of the active layers 402a and 402b is used to form the depletion-mode string selection transistor. Noticeably, when the active layers 402a and 402b are made of lightly doped polysilicon, the conductive type of the active layers 402a and 402b is as same as the conductive type of the heavily doped regions 454a and 454b. In other words, the conductive type throughout each of the active layers 402a and 402b is single.

Figures 5A, 5B:
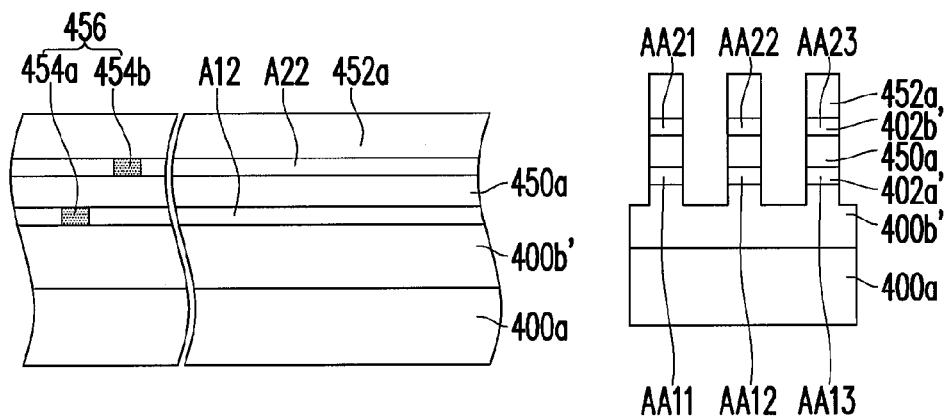

As shown in FIG. 5A and FIG. 5B, a patterning process is performed to transform the dielectric layers 452 and 450, the active layers 402a and 402b and the insulating layer 400b into dielectric layers 452a and 450a, active layers 402a' and 402b' and an insulating layer 400b'. Thus, each of the active layers 402a' and 402b' is composed of a plurality of rectangular active area regions for forming NAND strings respectively in later process steps. Further, the rectangular active area regions are parallel to each other. For instance, the active layer 402a' is composed the active area regions AA11, AA12 and AA13 and the active layer 402b' is composed the active area regions AA21, AA22 and AA23. Also, the active areas arranged in the same column of different active layers 402a' and 402b' are aligned each other. For instance, the active area region AA21 is aligned the active area region AA11, the active area region AA22 is aligned the active area region AA12 and the active area region AA23 is aligned the active area region AA13. The patterning process can be, for example, an etching process such as an anisotropic etching process.

As shown in FIG. 6A and FIG. 6B, a charge trapping structure 418 is formed over the substrate 400. The charge trapping structure 418 comprises a first insulating layer 418a, a charge trapping layer 418b and a second insulating layer 418c stacked on one another in sequence. The materials of the first insulating layer 418a, the charge trapping layer 418b and the second insulating layer 418c and the method for forming the first insulating layer 418a, the charge trapping layer 418b and the second insulating layer 418c are mentioned in the previous embodiment and are not repeatedly detailed herein. Thereafter, conductive layers 460 and 462 are formed over the substrate 400 to fill spaces between the active area regions of the same active layers. The conductive layer 462 can be can be made of, for example but not limited to, tungsten, cobalt or nickel. The conductive layer 460 can be, for example, a heavily doped polysilicon layer with N type or P type. In the other embodiment, the conductive layer 460 can be, for example, a complex layer composed of a thin metal layer and a polysilicon layer stacked on the thin metal layer. That is, between the polysilicon layer and the second insulating layer 418b, there is a thin metal layer. The aforementioned polysilicon layer can be, for example, a heavily doped polysilicon layer with N type or P type. The thin metal layer can be made of, for example but not limited to, tantalum nitride or titanium nitride. It should be noticed that, by forming the thin metal layer such as the tantalum nitride layer between the polysilicon layer and the second insulating layer 418b, the work function difference between the second insulating layer 418b and the thin metal layer can be widened and erase Vt used in the erasing operation of the memory device of the present invention can be decreased.

As shown in FIG. 7A and FIG. 7B, a patterning process is performed to transform the conductive layers 462 and 460 into a plurality of common word lines 464, at least one string selection line (such as the string selection lines SGD1 and SGD2 shown in FIG. 7A) and at least one source side selection line (such as the source side selection line SGS shown in FIG. 7A). The common word lines 464, the string selection lines SGD1 and SGD2 and the source side selection line SGS are parallel to each other and are configured over and across each of the active area regions of the active layers 402a' and 402b'. Moreover, each of the common word lines 464 comprises a top word line portion 464a and a gate line portion 464b. For each of the common word line 464, the top word line portion 464a crossing over the active area regions of the active layers 402a' and 402b' is composed of the patterned conductive layer 462a and a portion of the patterned conductive layer 460a. Also, for each of the common word line 464, the gate line portion 464b extends from the top layer of the active layers 402a' and 402b' to the bottom layer of the active layers 402a' and 402b'. Furthermore, the gate line portion 464b comprises a plurality of gate lines (such as the gate lines 468a, 468b, 468c and 468d shown in FIG. 7B). Each of the gate line extends form the top layer of the active layers to the bottom layer of the active layers. Thus, the gate lines 468a, 468b, 468c and 468d are used as gates of the memory cells of the NAND strings S1 and S2 of the active layers 402a' and 402b'. Further, each of the common word lines 464 is coupled to the memory cell arranged at the same row of different active layers (such as the active layers 402a' and 402b') through the gate lines (such as the gate lines 468a, 468b, 468c and 468d shown in FIG. 7B).

Similarly, each of the string selection lines SGD1 and SGD2 comprises a top string selection line portion and a string selection gate line portion. For each of the string selection lines SGD1 and SGD2, the top string selection line portion crossing over the active area regions of the active layers 402a' and 402b' is composed of the patterned conductive layer 462a and a portion of the patterned conductive layer 460a. Also, for each of the string selection lines SGD1 and SGD2, the string selection gate line portion extends from the top layer of the active layers 402a' and 402b' to the bottom layer of the active layers 402a' and 402b'. Furthermore, the string selection gate line portion comprises a plurality of string selection gate lines and each of the string selection gate lines extends form the top layer of the active layers to the bottom layer of the active layers. Thus, the string selection gate lines are used as gates of the string selection transistors of the NAND strings S1 and S2 of the active layers 402a' and 402b'. It should be noticed that, the heavily doped regions 454a and 454b respectively configured in the active layers 402a' and 402b' (i.e. the active area regions AA12 and AA22 shown in FIG. 7A) and the string selection gate lines of the string selection lines SGD1 and SGD2 together form depletion-mode string selection transistors respectively.

Similarly, each of the source side selection lines (such as the source side selection transistor SGS shown in FIG. 7A) comprises a top source side selection line portion and a source side selection gate line portion. For each of the source side selection line SGS, the top source side selection line portion crossing over the active area regions of the active layers 402a' and 402b' is composed of the patterned conductive layer 462a and a portion of the patterned conductive layer 460a. Also, for each of the source side selection lines SGS, the source side selection gate line portion extends from the top layer of the active layers 402a' and 402b' to the bottom layer of the active layers 402a' and 402b'. Furthermore, the source side selection gate line portion comprises a plurality of source side selection gate lines and each of the source side selection gate line extends form the top layer of the active layers to the bottom layer of the active layers. Thus, the source side selection gate lines are used as gates of the source side selection transistors of the NAND strings S1 and S2 of the active layers 402a' and 402b'.

Then, a dielectric layer 470 is formed over the substrate 400 and fills the spaces between the common word lines 464, the string selection lines SGD1 and SGD2 and the source side selection line SGS. In other words, the common word lines 464, the string selection lines SGD1 and SGD2 and the source side selection line SGS are separated form each other by the dielectric layer 470. The dielectric layer 470 can be made of, for example but not limited to, silicon oxide.

As shown in FIG. 8A and FIG. 8A', a patterning process is performed to form a trench 472 in the dielectric layer 470, the dielectric layers 452a and 450a and the active layer 402b' and the bottom of the trench 472 exposes a top surface of the bottom active layer (i.e. the active layer 402a') at the end portion of NAND strings S1 and S2 and beside the source side selection line SGS. The trench 472 is parallel to the common word lines 464, the source side selection line SGS and the string selection lines SGD1 and SGD2 in a longitudinal direction. Thereafter, a conductive layer 474 fills the trench 472 to form a common source line SL. The common source line SL is parallel to the common word lines 464, the source side selection line SGS and the string selection lines SGD1 and SGD2 in a longitudinal direction. Specifically, the common source line SL is coupled to the ends of the NAND strings of the active layers through a source line contact 474a. In other words, the common source line SL is in contact with each of the active area regions of the active layers through the source line contact 474a. The common source line SL can be made of, for example but not limited to, a polysilicon such as a heavily doped polysilicon with N type or P type. In one embodiment, the common source line SL can be formed by, for example, forming a heavily doped polysilicon layer to fill the trench 472, etching back the heavily doped polysilicon layer to form a shallow recess at the top of the trench 472 and then filling the shallow recess with a metal material such as tungsten.

Thereafter, a thermal process is performed to diffuse the dopants in the heavily doped common source line SL into the active layers 402a' and 402b' to form source line contact areas SC1 and SC2 respectively. Noticeably, the source line contact area SC1 between the source line contact 474a and the end of the NAND string S1 and the source line contact area SC2 between the source line connect 474a and the NAND string S2 are the doped areas with the single conductive type. Further, the doped areas are respectively formed in the source line contact 474a as well as the active layers 402a' and 402b'. More specifically, the aforementioned doped areas can be, for example, heavily doped areas having dopants with a relatively high dopant concentration and the single conductive type. It should be noticed that, when the active layers 402a' and 402b' are made of lightly doped polysilicon, the single conductive type of each of the source line contact areas (such as the source line contact areas SC1 and SC2 shown in FIG. 8A and the source line contact areas SC21, SC22, SC23 and SC24 shown in FIG. 8A') is as same as the conductive type of the active layers 402a' and 402b'. In another embodiment, when the active layers 402a' and 402b' are made of intrinsic-type polysilicon without having any dopant therein, the source line contact areas can be intrinsic-type doped regions or heavily doped regions with conductive type such as N type or P type.

In another embodiment, the source line contact areas SC1 and SC2 with relatively high dopant concentration can be formed in the step for forming the heavily doped regions 454a and 454b of the depletion-mode string selection transistors. That is, the source line contact areas SC1 and SC2 and the heavily doped regions 454a and 454b of the depletion-mode string selection transistors can be formed in the same implementation process.

In the other embodiment, the common source line SL can be also made of, for example but not limited to, barrier metal material/metal material such as tungsten/titanium tungsten/titanium. In this embodiment, the common source line SL made of metal materials can provide relatively low contact resistance between the active layers and the common source line SL even though there is no heavily doped contact areas between the common source line SL and the active layers.

As shown in FIG. 9A and FIG. 9A', a dielectric layer 480 is formed over the substrate 400. The dielectric layer can be made of, for example but not limited to, silicon oxide. Then, a patterning process is performed to form a plurality of contact holes 482 in the dielectric layers 480, 470, 452a and 450a and the active layer 402b' around the end region of the NAND strings S1 and S2 and beside the string selection transistors SGD1 and SGD2. Specifically, the bottoms of the contact holes 482 respectively expose top surfaces of the active area regions on the bottom active layer (i.e. the active layer 402a') at the end portion of NAND strings S1 and S2 and beside the string selection transistors SGD1 and SGD2. Thereafter, a conductive layer fills the contact holes 482 to form a plurality of bit line contacts 484. Further, a plurality common bit lines BL are formed over the substrate 400 and are respectively coupled to the bit line contacts 484. Each of the common bit lines BL is configured above the common word lines 464 and across each of the common word lines 464. More clearly, the longitudinal side of each of the common bit lines BL is perpendicular to the longitudinal side of each of the common word line 464. Moreover, each of the common bit lines BL is coupled to the corresponding end of each of the NAND strings of the active layers through the corresponding bit line contact 484. The common bit lines BL and the bit line contacts 484 can be made of, for example but not limited to, polysilicon such as heavily doped polysilicon with N type or P type. In one embodiment, the common bit lines BL and the bit line contacts 484 can be formed by, for example, forming a heavily doped polysilicon layer in the contact holes 482 to form the bit line contacts 484 and forming a conductive layer, such as copper or aluminum, over the substrate 400 and then patterning the conductive layer into the common bit lines BL.

Thereafter, a thermal process is performed to diffuse the dopants in the heavily doped bit line contacts 484 into the active layers 402a' and 402b' to form bit line contact areas BC1 and BC2 respectively. Noticeably, the bit line contact area BC1 between the bit line contact 484 and the end of the NAND string S1 and the bit line contact area BC2 between the bit line connect 484 and the NAND string S2 are the doped areas with the single conductive type. Further, the doped areas are respectively formed in the bit line contact 484 as well as the active layers 402a' and 402b'. More specifically, the aforementioned doped areas can be, for example, heavily doped areas having dopants with a relatively high dopant concentration and the single conductive type. It should be noticed that, when the active layers 402a' and 402b' are made of lightly doped polysilicon, the single conductive type of each of the bit line contact areas (such as the bit line contact areas BC1 and BC2 shown in FIG. 9A and the bit line contact areas BC21, BC22, BC23 and BC24 shown in FIG. 9A') is as same as the conductive type of the active layers 402a' and 402b'. That is, the conductive type throughout each of the active layers 402a' and 402b' (i.e. each of the active area regions of the active layers) is single. In another embodiment, when the active layers 402a' and 402b' are made of intrinsic-type polysilicon without having any dopant therein, the bit line contact areas can be intrinsic-type doped regions or heavily doped regions with conductive type such as N type or P type.

In the other embodiment, the bit line contact areas BC1 and BC2 with relatively high dopant concentration can be formed in the step for forming the heavily doped regions 454a and 454b of the depletion-mode string selection transistors. That is, the bit line contact areas BC1 and BC2 and the heavily doped regions 454a and 454b of the depletion-mode string selection transistors can be formed in the same implementation process.

In the other embodiment, the bit line contacts 484 can be also made of, for example but not limited to, barrier metal material/metal material such as tungsten/titanium tungsten/titanium. In this embodiment, the bit line contacts 484 made of metal materials can provide relatively low contact resistance between the active layers and the common bit line BL even though there is no heavily doped contact areas between the common bit line BL and the active layers.

Figure 10A:
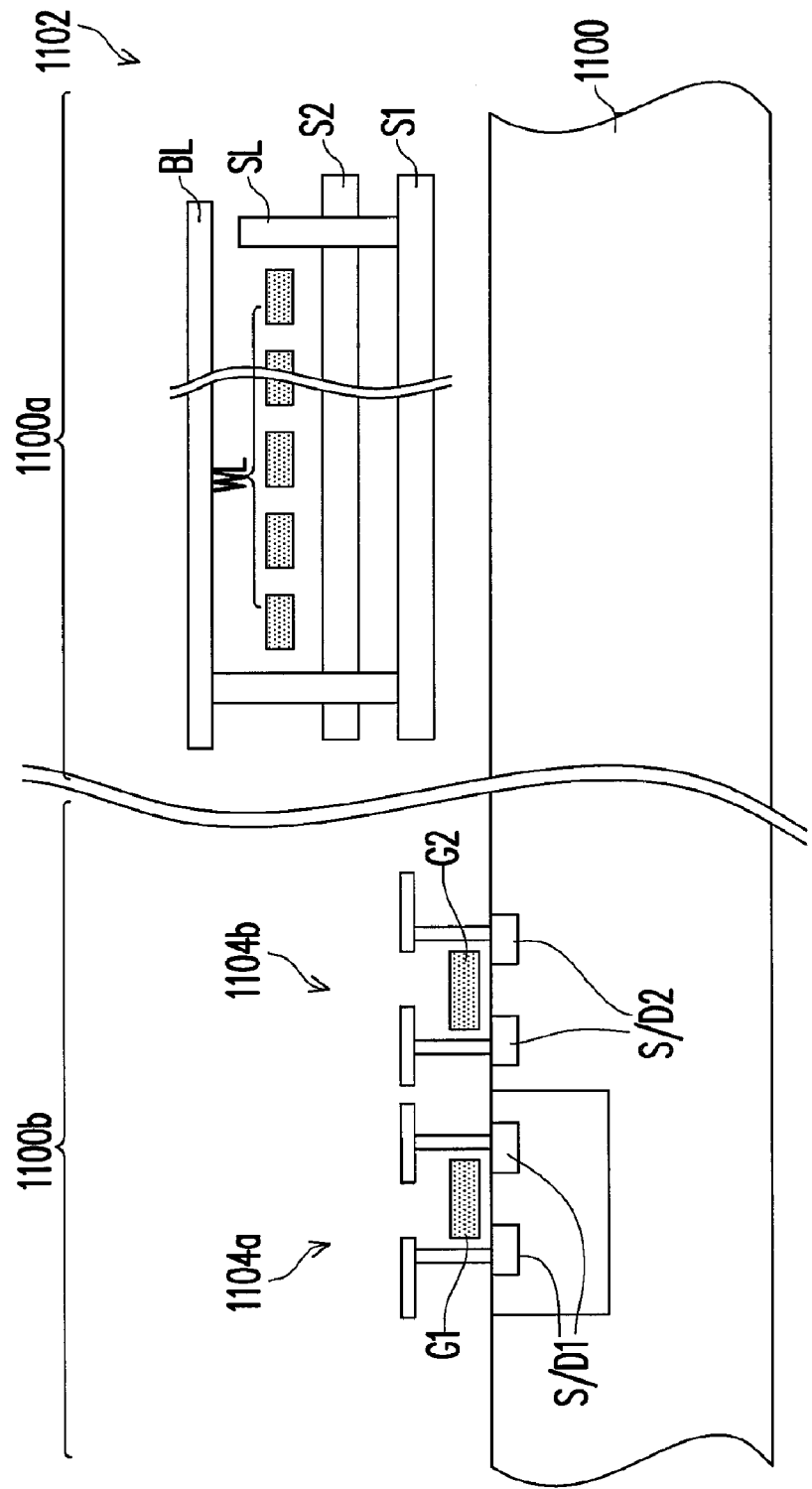
FIG. 10A is a cross-sectional view showing a memory device according to one embodiment of the present invention.
Figure 10B:
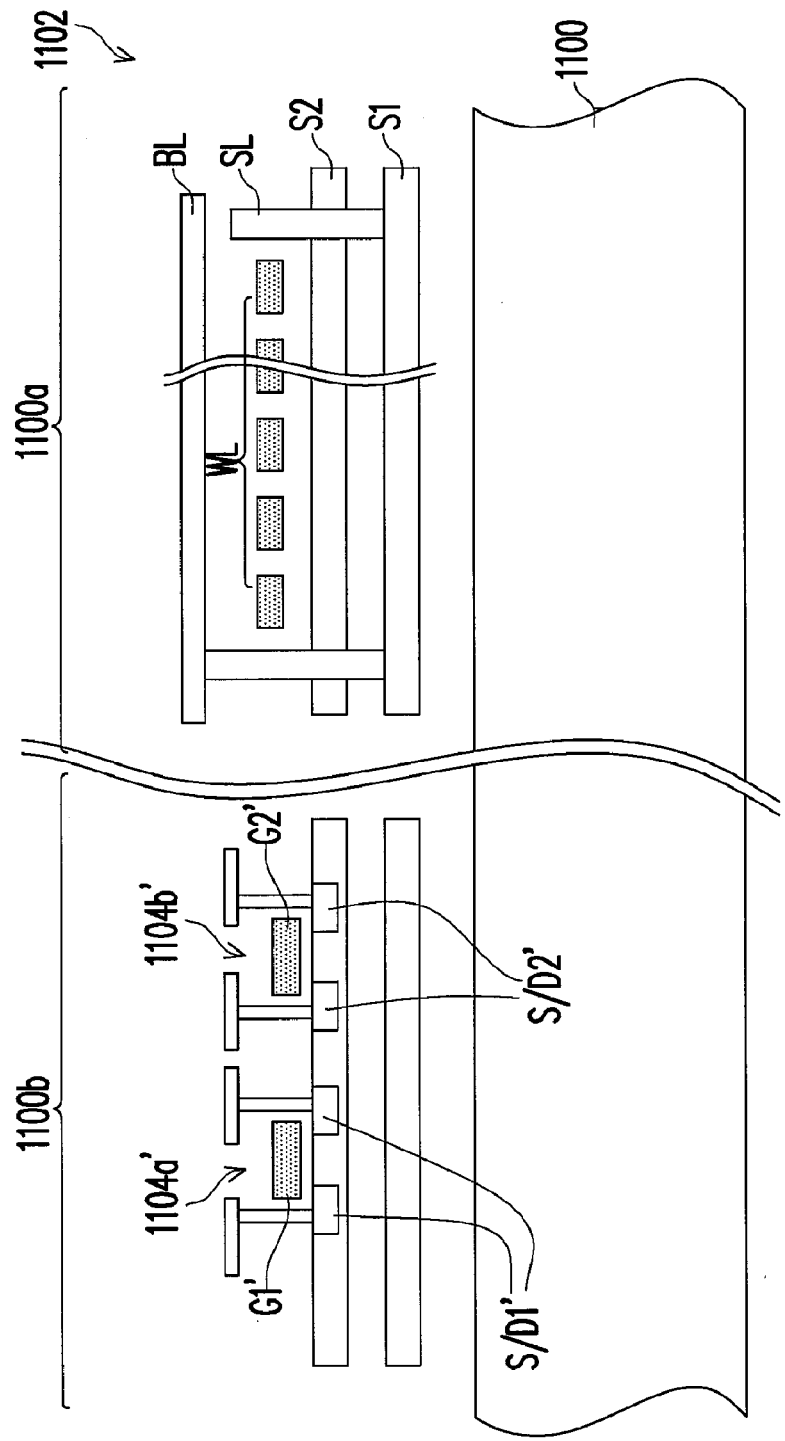
FIG. 10B is a cross-sectional view showing a memory device according to another embodiment of the present invention.

In addition, there are transistors formed at the periphery region of the memory region where the NAND strings are disposed. Some of the transistors in the periphery region can be used to control the common bit lines, the common source line, the word lines, the source side selection lines and the string selection lines of the memory device. The following descriptions accompanied with FIG. 10A and FIG. 10B illustrate the variations of the transistors on the periphery region. FIG. 10A is a cross-sectional view showing a memory device according to one embodiment of the present invention. As shown in FIG. 10A, the substrate 1100 has a memory region 1100a and a periphery region 1100b. In the memory region 1100a, a memory device 1102 having at least two active layers of NAND strings, such as NAND strings S1 and S2, is disposed. For simplifying the drawing, the dielectric layers between the active layers, between the common word lines WL, between the common word lines WL and the common source line SL and between the common source line SL and the common bit lines BL are omitted. It is clear that the transistors 1104a and 1104b are formed on the substrate 1100 in the periphery region 1102b. Thus, the source/drain regions S/D1 and S/D2 of the transistors 1104a and 1104b are formed in the substrate 1100. It should be noticed that the materials of the gates G1 and G2 of the transistors 1104a and 1104b and the materials of the word lines WL can be the same. Furthermore, the gates G1 and G2 of the transistors 1104a and 1104b and the word lines WL can be formed in the same process step.

FIG. 10B is a cross-sectional view showing a memory device according to another embodiment of the present invention. The structures of the memory devices in the memory regions and the transistors in the periphery regions respectively shown in FIG. 10A and FIG. 10B are similar to each other, and the difference between thereto is that, as shown in FIG. 10B, the transistors of the present embodiment are formed on the top layer of the active layers of the NAND strings in the periphery region 1100b. That is, the transistors 1104a' and 1104b' shown in FIG. 10B are formed on the top layer of the active layers of NAND strings S1 and S2 in the periphery region 1102b. Thus, the source/drain regions S/D1' and S/D2' of the transistors 1104a' and 1104b' are formed in the top layer of the active layers of NAND strings S1 and S2. It should be noticed that the materials of the gates G1' and G2' of the transistors 1104a' and 1104b' and the materials of the word lines WL of the memory device in the memory region 1100a can be the same. Furthermore, the gates G1' and G2' of the transistors 1104a' and 1104b' and the word lines WL can be formed in the same process step. Further, in the present embodiment, the substrate 1100 can be, for example, a silicon substrate or a glass substrate.

Moreover, the transistors formed in the periphery region are not limited to be formed in the same height level. In other words, the transistors in the periphery region can be formed in different active layers (i.e. different height levels) according to the practical requirements.

Figure 11A:
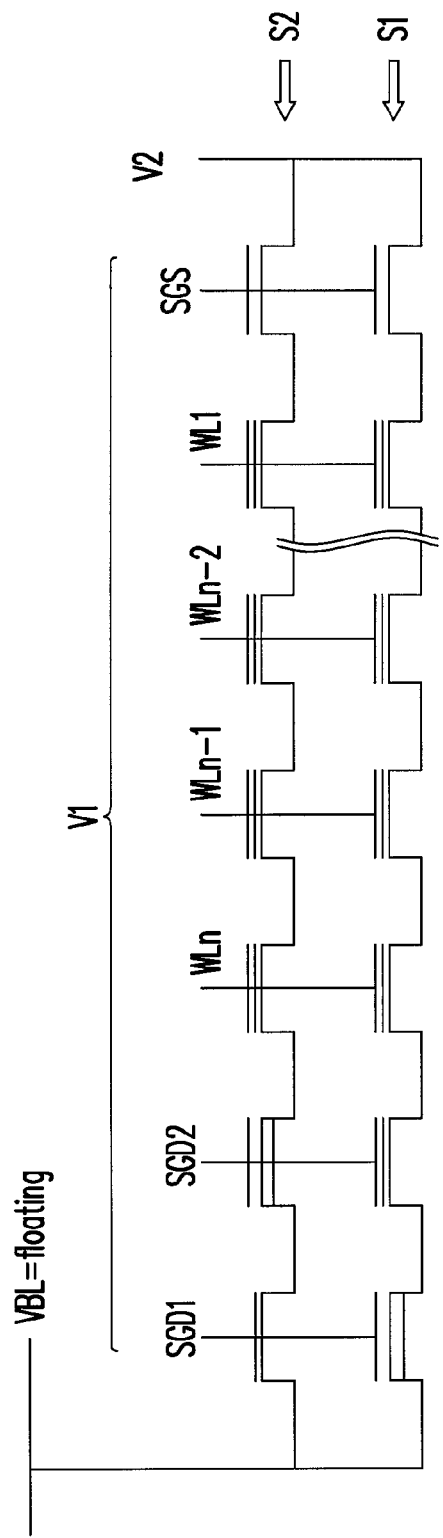
FIGS. 11A through 11C are equivalent circuit diagrams showing an erasing operation of a memory device according to one embodiment of the present invention.
Figure 11B:
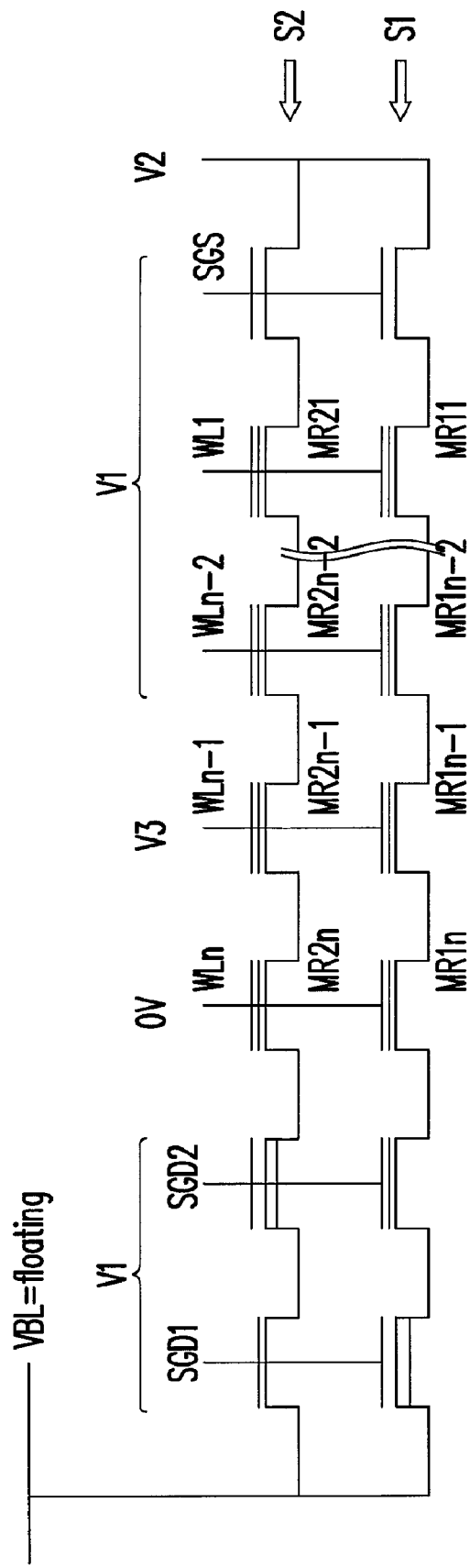
Figure 11C:
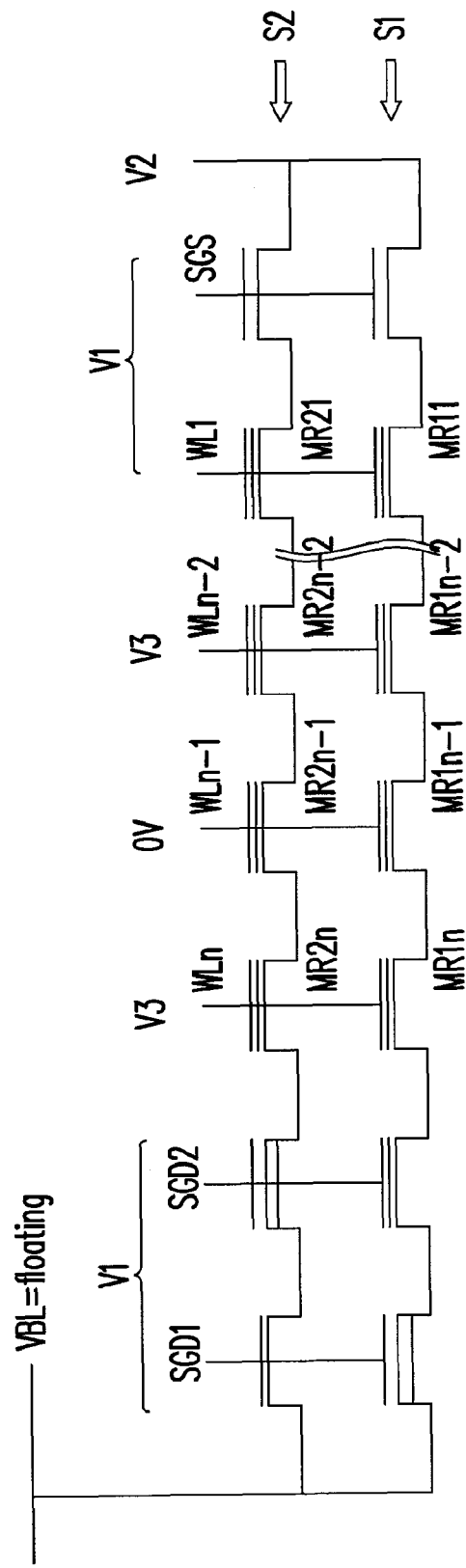

FIGS. 11A through 11C are equivalent circuit diagrams showing an erasing operation of a memory device shown in FIG. 1 according to one embodiment of the present invention. As shown in FIG. 11A, when the memory cells of the NAND strings S1 and S2 a are selected to be erased, a first voltage V1 is applied on the common word lines WL1 through WLn respectively coupled to the memory cells of the selected NAND strings S1 and S2. Meanwhile, a second voltage V2 is applied on the common source line SL coupled to the second end of the selected NAND string. Furthermore, at the time the first voltage V1 is applied on the common word line respectively coupled to the memory cells of the NAND strings S1 and S2, the first voltage V1 is also applied on the source side selection line SGS and on the string selection lines SGD1 and SGD2. Therefore, all channels of the memory cells of the NAND strings are raised to a voltage substantially equal to the second voltage V2. At the meantime, the common bit line BL coupled to the first end of the NAND strings S1 and S2 is at a floating state. It should be noticed that the first voltage V1 is lower than or equal to the second voltage V2 and is higher than zero voltage.

As shown in FIG. 11B and FIG. 11C, when the common word lines WLn through WL1 are sequentially grounded from the first ends of the NAND strings S1 and S2 near the common word line WLn to the second ends of the selected NAND strings S1 and S2 near the common word line WL1, the memory cells of the NAND strings S1 and S2 are sequentially erased from the first ends to the second ends. Meanwhile, the string selection lines SGD1 and SGD2 and the source side selection line SGS are applied with the first voltage V1.

In one embodiment, as shown in FIG. 11B, when the voltage of the common word line WLn is pulled down to be zero voltage or grounded, the memory cells MR1n and MR2n of the NAND strings S1 and S2 which are coupled to the common word line WLn are erased and, meanwhile, the common word line WLn−1 directly adjacent to the grounded common word line WLn is applied with a third voltage V3 or floating and the rest of the common word lines (except for the common word lines WLn and WLn−1) are still applied with the first voltage V1. It should be noticed that the third voltage V3 is smaller than the first voltage V1 but higher than zero voltage so that the electric field between the common word lines WLn and WLn−1 can be reduced. Then, as shown in FIG. 11C, when the voltage of the common word line WLn−1 is pulled down to be zero voltage or grounded, the memory cells MR1n−1 and MR2n−1 of the NAND strings S1 and S2 which are coupled to the common word line WLn−1 are erased and, meanwhile, the common word lines WLn and WLn−2 directly adjacent to the grounded common word line WLn−1 are applied with the third voltage V3 or floating and the rest of the common word lines (except for the common word lines WLn, WLn−1 and WLn−2) are still applied with the first voltage V1. Thereafter, the memory cells coupled to the rest of the common word lines WLn−2 through WL1 are erased sequentially according to the above description.

In the aforementioned embodiment, the memory cells MRn through MR1 are sequentially erased in a direction from the first end to the second end of the selected NAND string. However, the erasing operation of the memory device is not limited to the above description. That is, when the common word lines WL1 through WLn are sequentially grounded from the second ends to the first ends of the selected NAND strings S1 and S2, the memory cells of the NAND strings S1 and S2 are sequentially erased from the second ends to the first ends according to the similar voltage applying mechanism mentioned above.

Furthermore, in the above descriptions, the memory cells of the selected NAND strings are sequentially erased according to an erasing order. However, the erasing operation of the memory device is not limited to the above description. The memory cells of the selected NAND string can be selectively erased instead of being sequentially erased. Under the similar voltage applying mechanism mentioned above, when the common word lines, which are respectively coupled to the memory cells selected from the memory cells of the NAND string, are grounded at the same time, the selected memory cells are selectively erased. In other words, when the common word lines coupled to the selected memory cells are applied with the zero voltage or grounded at the same time, the selected memory cells from the memory cells of the NAND string are selectively erased.

Moreover, when the common word lines which are respectively coupled to the memory cells in a continuous region of the selected NAND string, are grounded at the same time, the memory cells in the continuous region of the selected NAND string are erased at the same time. For instance, the common word lines WLn through WLn−i (i is a natural number) are respectively coupled to the memory cells MR1n through MR1n−i and MR2n through MR2n−i (as shown in FIG. 1) which are serially connected to each other in a continuous region of the NAND strings S1 and S2 respectively. When the common word lines WLn through WLn−i are applied with zero voltage or grounded at the same time, the memory cells MR1n through MR1n−i and MR2n through MR2n−i in the continuous region of the NAND strings S1 and S2 are erased at the same time.

In addition, when the common word lines WL1 through WLn respectively coupled to the memory cells MR11 through MR1n and MR21 through MR2n of the selected NAND strings S1 and S2 are all applied with zero voltage or grounded at the same time, all of the memory cells of the selected NAND strings S1 and S2 are erased at the same time.

Moreover, as for the unselected NAND strings other than the selected NAND strings to be erased, the common word lines, the string selection lines, the source side selection lines are applied with the first voltage or are floating.

Figure 12:
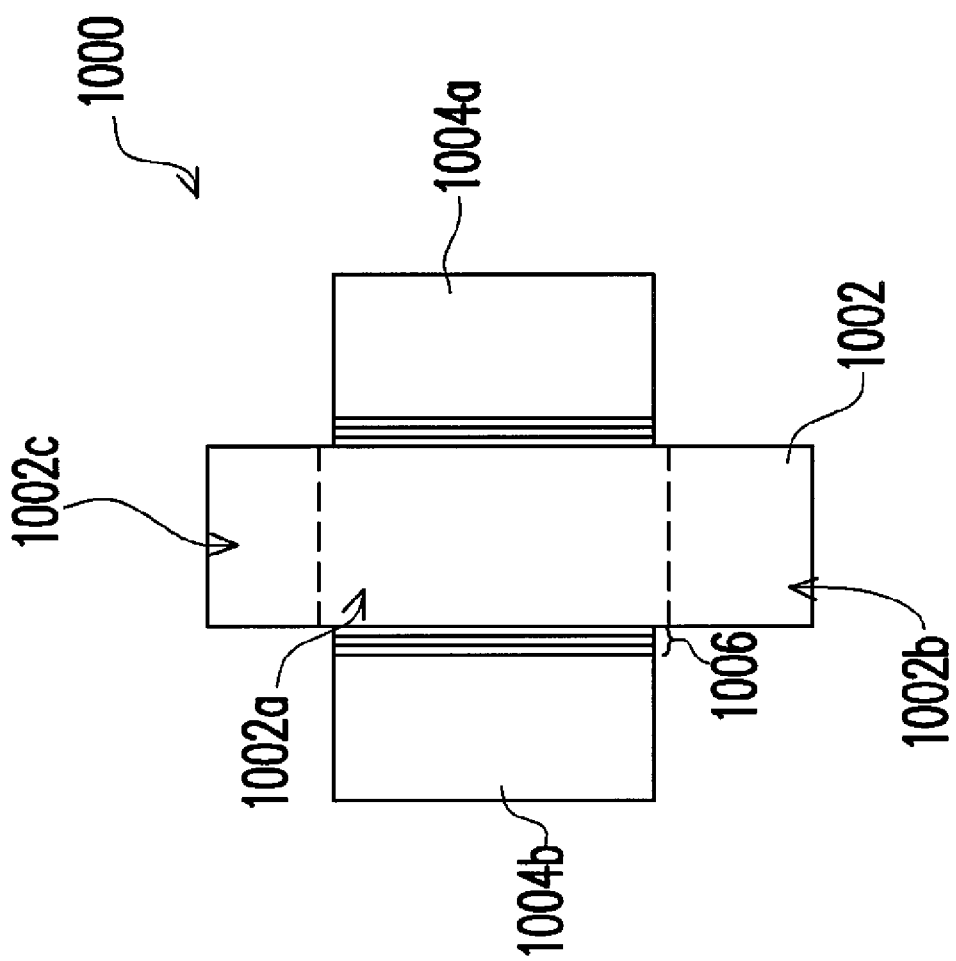
FIG. 12 is a top view showing a memory cell of the memory device according to one embodiment of the present invention.

FIG. 12 is a top view showing a memory cell of the memory device according to one embodiment of the present invention. As shown in FIG. 12, the memory cell 1000 comprises an active region 1002 of the active layer (such as the active layers 402a' and 402b' shown in FIG. 5A). The memory cell 1000 also comprises gate lines 1004a and 1004b respectively configured at two opposite sides of the active layer. Each of the gate lines 1004a and 1004b is separated from the active region 1002 by a charge trapping structure 1006. Moreover, the active region 1002 further is divided into a channel region 1002a between the gate lines 1004a and 1004b, and source/drain regions 1002b and 1002c. According to the above descriptions, for each of the NAND strings of the active area regions, the active layers are made of lightly doped polysilicon and the conductive type of the active area region is single which means the conductive type of the active area region is single conductive type. In another embodiment, the active layers can be made of the intrinsic-type polysilicon while the bit line contact areas and the source line contact areas are intrinsic-type doped regions or heavily doped regions with single conductive type. Thus, in the memory cell 1000, the channel region 1002a is fully depleted while the voltage applied on the gate lines 1004a and 1004b is smaller than the threshold voltage. Thus, the leakage current through the fully depleted memory cell can be effectively suppressed.

Conventionally, it is necessary to further form doped region in the active layers to define the channel region with the conductive type different from the doped region. However, it is hard to form the doped region in each of the active layers with the increasing of the integration and the decreasing of the size of the memory device and misalignment happens easily. On the other hand, in the present invention, since the conductive type of the active area region is single, the manufacturing process of the memory device is much simpler.

The common bit lines, the string selection lines, the common word lines, the source side selection line and the common source line are formed in the substrate or material layer before the stacked semiconductor layers are formed in the conventional manufacturing process. Thus, the materials of the common bit lines, the string selection lines, the common word lines, the source side selection line and the common source line cannot be metal material due to relatively small thermal budget. However, in the present invention, the common bit lines, the string selection lines, the common word lines, the source side selection line and the common source line are formed after the stacked semiconductor layers/active layers are formed, the selection of the material for the common bit lines, the string selection lines, the common word lines, the source side selection line and the common source line is not limited to the thermal budget. In other words, the material of the common bit lines, the string selection lines, the common word lines, the source side selection line and the common source line can be metal material for providing relatively high operation speed and relatively stable function in the operations of the memory device, such as reading operation and programming operation.

Furthermore, in the conventional method, it is necessary to form the contact holes to respectively expose the common bit lines, the string selection lines, the common word lines, the source side selection line and the common source line formed under the stacked semiconductor layers. However, with the increasing integration and the decreasing size of the memory device, it is not easy to accurately align the contact holes to the common bit lines, the string selection lines, the common word lines, the source side selection line and the common source line respectively. In other words, misalignment happens easily.

In addition, in the present invention, since the common word lines, the string selection line and the source side selection line are formed after the stacked active layers are formed, the first insulating layer of the charge trapping structure can be formed by the thermal oxidation process. It is well known that the quality of thermal silicon oxide (which is the silicon oxide made by the thermal oxidation process) is usually much better than that of the CVD silicon oxide (which is the silicon oxide made by the CVD process). Therefore, the leakage current of the first insulating layer formed by the thermal oxidation process is much fewer than the insulating layer formed by using the CVD process. Further, the first insulating layer/bottom insulating layer formed by the thermal oxidation process has much fewer charge trap than the insulating layer formed by the CVD process. Hence, by using the first insulating layer/bottom insulating layer formed by the thermal oxidation process, the reliability of the memory cell is improved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A memory device on a substrate, comprising
a plurality of semiconductor layers stacked on one another on the substrate, wherein each of the semiconductor layers has a plurality of NAND strings, and each of the NAND strings includes a plurality of memory cells and at least a string selection transistor, and each of the NAND strings has a first end and a second end;
a plurality of common word lines configured above the semiconductor layers, wherein each of the common word lines is coupled to the memory cells arranged in a same row of the plurality of semiconductor layers stacked on one another;
a plurality of common bit lines configured on the common word lines, wherein each of the common bit lines is coupled to the first ends of the NAND strings arranged in the same column of the semiconductor layers; and
a common source line configured on the common word lines, wherein the common source line is coupled to the second ends of the NAND strings of the semiconductor layers.

2. The memory device of claim 1, wherein each of the common word lines is composed of a top metal layer and a bottom polysilicon layer.

3. The memory device of claim 2, wherein the top metal layer is made of tungsten, cobalt, nickel or tungsten silicide.

4. The memory device of claim 1, wherein, each of the memory cells is composed of an active area extending along a first direction, a first gate line extending along a second direction perpendicular to the first direction, a second gate line extending along third direction parallel to the second direction and a charge trapping structure, and the first gate line and the second gate line are configured at two opposite sides of the active area and the charge trapping structure is configured between the active area and the first gate line and between the active area and the second gate line.

5. The memory device of claim 4, wherein the charge trapping structure comprises a first insulating layer, a charge trapping layer and a second insulating layer stacked on one another in sequence.

6. The memory device of claim 1, wherein each of the NAND strings comprises at least a source side selection transistor configured at the second end of the NAND string and between the memory cells and the common source line.

7. The memory device of claim 1, wherein a number of the string selection transistors of each of the NAND strings is equal to a number of the semiconductor layers.

8. The memory device of claim 1 further comprising at least a string selection line coupled to the string selection transistors arranged in a same row of the semiconductor layers.

9. The memory device of claim 1, wherein each of the common bit lines is coupled to the first ends of the NAND strings arranged in the same column of the semiconductor layers through a bit line contact and a bit line contact area between the bit line contact and each of the first ends of the NAND strings arranged in the same column of the semiconductor layers is a heavily doped area with a single conductive type.

10. The memory device of claim 1, wherein the common source line is coupled to the second ends of the NAND strings of the semiconductor layers through a source line contact and a source line contact area between the source line contact and each of the second ends of the NAND strings of the semiconductor layers is a heavily doped area with a single conductive type.

11. A memory device on a substrate, comprising
a plurality of semiconductor layers stacked on one another on the substrate, wherein each of the semiconductor layers has a plurality of NAND strings, and each of the NAND strings includes a plurality of memory cells and at least a string selection transistor, and each of the NAND strings has a first end and a second end;
a plurality of common word lines, wherein each of the common word lines is coupled to the memory cells arranged in a same row of the plurality of semiconductor layers stacked on one another;
a plurality of common bit lines, wherein each of the common bit lines is coupled to the first ends of the NAND strings arranged in the same column of the semiconductor layers through a bit line contact, and a bit line contact area between the bit line contact and each of the first ends of the NAND strings arranged in the same column of the semiconductor layers is a first heavily doped area with a single conductive type; and
a common source line, wherein the common source line is coupled to the second ends of the NAND strings of the semiconductor layers through a source line contact and a source line contact area between the source line contact and each of the second ends of the NAND strings of the semiconductor layers is a second heavily doped area with the single conductive type.

12. The memory device of claim 11, wherein the common word lines are configured above the semiconductor layers, and the common bit lines and the common source line are configured on the common word lines.

13. The memory device of claim 11, wherein the single conductive type is an N type or P type or intrinsic type without impurity dopant.

14. The memory device of claim 11, wherein each of the common word lines is composed of a top metal layer and a bottom polysilicon layer, and the material of the top metal layer includes tungsten, cobalt, nickel or tungsten silicide.

15. The memory device of claim 11, wherein each of the common word lines is composed of a top metal layer and a bottom complex layer, and the material of the top metal layer includes tungsten, cobalt, nickel or tungsten silicide, and the bottom complex layer includes a thin metal layer and a polysilicon layer stacked on the thin metal layer.

16. The memory device of claim 11, wherein, each of the memory cells is composed of an active area extending along a first direction, a first gate line extending along a second direction perpendicular to the first direction, a second gate line extending along third direction parallel to the second direction and a charge trapping structure, and the first gate line and the second gate line are configured at two opposite sides of the active area and the charge trapping structure is configured between the active area and the first gate line and between the active area and the second gate line.

17. The memory device of claim 16, wherein the charge trapping structure comprises a first insulating layer, a charge trapping layer and a second insulating layer stacked on one another in sequence.

18. The memory device of claim 11, wherein each of the NAND strings comprises at least a source side selection transistor configured at the second end of the NAND string and between the memory cells and the common source line.

19. The memory device of claim 11, wherein a number of the string selection transistors of each of the NAND strings is equal to a number of the semiconductor layers.

20. The memory device of claim 11 further comprising at least a string selection line coupled to the string selection transistors arranged in a same row of the semiconductor layers.

21. A method for operating a memory device, wherein the memory device comprises a plurality of semiconductor stacked layers of a plurality of NAND strings, and each of the NAND strings has a first end and a second end, and each of the NAND strings includes a plurality of memory cells serially connected to one another, and the memory device further comprises a plurality of common word lines, and each of the common word lines is coupled to the memory cells arranged in a same row of the semiconductor layers, the method comprising:
performing an erasing operation on the memory cells of a selected NAND string from the NAND strings, wherein the erasing operation comprises:
applying a first voltage on the common word lines respectively coupled to the memory cells of the selected NAND string and applying a second voltage on a common source line coupled to the second end of the selected NAND string;
sequentially erasing the memory cells of the selected NAND string from the first end to the second end of the selected NAND string if the common word lines are sequentially grounded from the first end to the second end of the selected NAND string;
sequentially erasing the memory cells of the selected NAND string from the second end to the first end of the selected NAND string if the common word lines are sequentially grounded from the second end to the first end of the selected NAND string;
selectively erasing the memory cells selected from the memory cells of the selected NAND string if the common word lines respectively coupled to the selected memory cells are grounded at the same time;
erasing a continuous portion of memory cells of the selected NAND string if the common word lines respectively coupled to the continuous portion of the memory cells are grounded at the same time; and erasing all of the memory cells of the selected NAND string at the same time if the common word lines respectively coupled to the memory cells of the selected NAND string are all grounded at the same time.

22. The method of claim 21, wherein the first voltage is lower than or equal to the second voltage and is higher than zero voltage.

23. The method of claim 21, wherein a common bit line coupled to the first end of the selected NAND string is at a floating state.

24. The method of claim 21, wherein the NAND string further includes at least a string selection transistor beside the first end and at least a source side selection transistor beside the second end, and the memory cells are located between the string selection transistor and the source side selection transistor, and the step of applying the first voltage on the common word line respectively coupled to the memory cells of the NAND string further comprises applying the first voltage on a source side selection line coupled to the source side selection transistor and on a string selection line coupled to the string selection transistor.

* * * * *